(12) United States Patent
Nishikiori et al.

(10) Patent No.: US 10,672,838 B2
(45) Date of Patent: Jun. 2, 2020

(54) ORGANIC EL DISPLAY PANEL AND ORGANIC EL DISPLAY PANEL MANUFACTURING METHOD

(71) Applicant: JOLED INC., Tokyo (JP)

(72) Inventors: Toshiki Nishikiori, Tokyo (JP); Noriteru Maeda, Tokyo (JP); Toshio Fukuda, Tokyo (JP)

(73) Assignee: JOLED INC., Tokyo (JP)

( * ) Notice: Subject to any disclaimer, the term of this patent is extended or adjusted under 35 U.S.C. 154(b) by 25 days.

(21) Appl. No.: 16/010,565

(22) Filed: Jun. 18, 2018

(65) Prior Publication Data

US 2018/0374909 A1 Dec. 27, 2018

(30) Foreign Application Priority Data

Jun. 23, 2017 (JP) ................................. 2017-122868

(51) Int. Cl.
*H01L 27/32* (2006.01)
*H01L 51/56* (2006.01)

(52) U.S. Cl.
CPC ...... *H01L 27/3223* (2013.01); *H01L 27/3246* (2013.01); *H01L 51/56* (2013.01); *H01L 27/3258* (2013.01); *H01L 2227/323* (2013.01)

(58) Field of Classification Search
None
See application file for complete search history.

(56) References Cited

U.S. PATENT DOCUMENTS

| 9,461,099 | B2* | 10/2016 | Kim | ................... H01L 27/3246 |
| 10,014,354 | B2* | 7/2018 | Kondo | ................ H01L 27/3276 |
| 10,388,912 | B2* | 8/2019 | Choi | .................. H01L 51/5256 |
| 2002/0064966 | A1 | 5/2002 | Seki et al. | |
| 2004/0166761 | A1 | 8/2004 | Seki et al. | |
| 2005/0264186 | A1 | 12/2005 | Seki et al. | |
| 2005/0264187 | A1 | 12/2005 | Seki et al. | |
| 2005/0266169 | A1 | 12/2005 | Seki et al. | |
| 2007/0018152 | A1 | 1/2007 | Seki et al. | |
| 2008/0315760 | A1 | 12/2008 | Seki et al. | |
| 2009/0009075 | A1 | 1/2009 | Seki et al. | |
| 2009/0302333 | A1 | 12/2009 | Seki et al. | |
| 2013/0248834 | A1 | 9/2013 | Seki et al. | |

(Continued)

FOREIGN PATENT DOCUMENTS

JP 2005-259717 A 9/2005
JP 2009-129606 A 6/2009

*Primary Examiner* — Telly D Green
(74) *Attorney, Agent, or Firm* — Hauptman Ham, LLP

(57) ABSTRACT

An organic EL display panel including a substrate, an element array, a planarizing layer, light emitting layers, and a dummy light emitting layer. The element array is disposed above the substrate and includes a light emitting region and a peripheral region that does not emit light surrounding the light emitting region. The planarizing layer is disposed between the substrate and the element array so as to cover the substrate. The light emitting layers are present in the element array in the light emitting region and include organic light emitting material. The dummy light emitting layer is present in the element array in the peripheral region and includes organic light emitting material. A portion of the planarizing layer below the dummy light emitting layer is recessed, and a lower portion of the dummy light emitting layer extends inside the recessed portion.

10 Claims, 19 Drawing Sheets

(56) References Cited

U.S. PATENT DOCUMENTS

| | | | |
|---|---|---|---|
| 2014/0225095 A1 | 8/2014 | Seki et al. | |
| 2016/0049450 A1* | 2/2016 | Kim | H01L 27/3246 |
| | | | 257/40 |
| 2017/0069696 A1* | 3/2017 | Kondo | H01L 27/3276 |
| 2018/0233691 A1* | 8/2018 | Ajiki | H01L 27/3279 |
| 2018/0286935 A1* | 10/2018 | Kondo | H01L 27/3276 |
| 2018/0358573 A1* | 12/2018 | Maeda | H01L 51/5036 |
| 2019/0181200 A1* | 6/2019 | Jung | H01L 51/5012 |
| 2019/0198811 A1* | 6/2019 | Choi | H01L 51/5259 |
| 2019/0206973 A1* | 7/2019 | Kim | H01L 27/3211 |
| 2019/0207166 A1* | 7/2019 | Lee | H01L 27/3211 |

* cited by examiner

ORGANIC EL DISPLAY PANEL AND ORGANIC EL DISPLAY PANEL MANUFACTURING METHOD

This application claims priority to Japanese Patent Application No. 2017-122868 filed Jun. 23, 2017, the contents of which are hereby incorporated by reference in their entirety.

BACKGROUND

Technical Field

The present disclosure relates to organic electroluminescence (EL) display panels that use organic EL elements that make use of electroluminescence of an organic material, and to methods of manufacturing such organic EL display panels.

Description of Related Art

In recent years, organic EL display panels in which organic EL elements are arrayed in a matrix on a substrate are being implemented as display panels used in display devices such as digital televisions.

Each organic EL element has a structure in which a light emitting layer including an organic light emitting material is disposed between a pair of electrodes. The light emitting layer of a given organic EL element and the light emitting layer of an adjacent organic EL element are divided by an insulating layer including an insulating material. When driven, a voltage is applied between the pair of electrodes, and the organic EL element emits light according to recombination of holes and electrons injected into the light emitting layer.

When manufacturing an organic EL display panel as described above, and particularly in production of a light emitting layer or the like, a liquid ink of an organic light emitting material is discharged and applied onto a substrate by using a droplet discharge method (inkjet method), and dried.

At this time, partial pressure of solvent molecules evaporated from applied liquid ink is low in peripheral portions (upper portion, lower portion, right portion, left portion) of an application region on the substrate, and therefore drying occurs faster in the peripheral portions than in a central portion of the application region on the substrate. This difference in drying time of the liquid ink applied on the substrate may cause unevenness in film thickness of light emitting layers between pixels in the peripheral portions and pixels in the central portion, and may be a cause of luminance unevenness between pixels in the peripheral portions and pixels in the central portion (JP 2005-259717).

In order to solve such a problem, according to JP 2009-129606, a first display panel includes a light emitting region and a first peripheral region surrounding the light emitting region. In the light emitting region, liquid ink is discharged and applied to pixel regions arranged in a matrix on a substrate. Further, in the first peripheral region, the liquid ink is discharged and applied to dummy pixel regions as dummies. In this way, evaporation of the liquid ink applied to the first peripheral region suppresses excessive evaporation of the liquid ink applied to the peripheral portions of the light emitting region, and therefore a difference in drying time of the central portion and drying time of the peripheral portions of the light emitting region can be mitigated, and occurrence of unevenness of film thickness between light emitting layers can be suppressed.

However, providing the first peripheral region including a large number of dummy pixels around the light emitting area leads to a problem of an increase in overall device size.

In order to solve this problem, JP 2009-129606 describes a technique of narrowing width of the first peripheral region. According to this technique, a second display panel has the light emitting region as described above and a second peripheral region that has a narrower width than the first peripheral region. In the second peripheral region, an amount of liquid ink that is the same as a total amount of liquid applied to dummy pixel regions arranged in a row direction of the first peripheral region, for example, is discharged and applied. The same amount of liquid ink as the total amount of liquid ink applied to the first peripheral region is applied to the second peripheral region, and therefore the second display panel achieves the same effect as the first display panel while width of the second peripheral region is narrower than width of the first peripheral region. Thus, device enlargement is suppressed.

SUMMARY

The present disclosure includes an organic EL display panel and a manufacturing method applicable to manufacturing the organic EL display panel such that width of a peripheral region including a dummy pixel that does not contribute to light emission is narrow, in order to suppress device enlargement.

An organic EL display panel pertaining to at least one aspect of the present disclosure is an organic EL display panel including a substrate, an element array, a planarizing layer, light emitting layers, and a dummy light emitting layer. The element array is disposed above the substrate and includes a light emitting region and a peripheral region that does not emit light surrounding the light emitting region. The planarizing layer is disposed between the substrate and the element array so as to cover the substrate. The light emitting layers are present in the element array in the light emitting region and include organic light emitting material. The dummy light emitting layer is present in the element array in the peripheral region and includes organic light emitting material. A portion of the planarizing layer below the dummy light emitting layer is recessed, and a lower portion of the dummy light emitting layer extends inside the recessed portion.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

DETAILED DESCRIPTION

1. Overview

Figure 1:
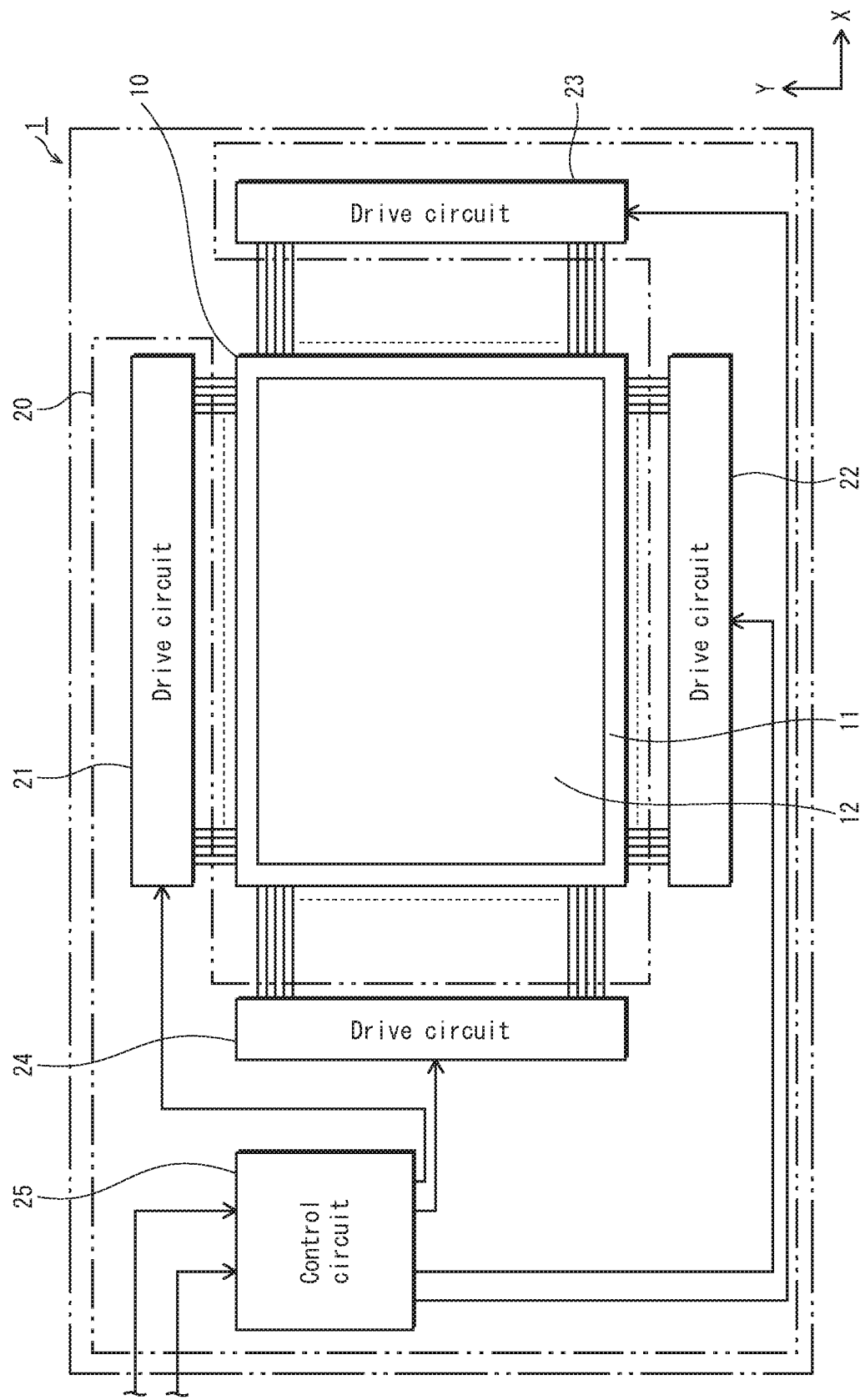
FIG. 1 is a block diagram illustrating a circuit configuration of an organic EL display device 1 according to at least one embodiment.

An organic EL display panel pertaining to at least one aspect of the present disclosure is an organic EL display panel including a substrate, an element array, a planarizing layer, light emitting layers, and a dummy light emitting layer. The element array is disposed above the substrate and includes a light emitting region and a peripheral region that does not emit light surrounding the light emitting region. The planarizing layer is disposed between the substrate and the element array so as to cover the substrate. The light emitting layers are present in the element array in the light emitting region and include organic light emitting material. The dummy light emitting layer is present in the element array in the peripheral region and includes organic light emitting material. A portion of the planarizing layer below the dummy light emitting layer is recessed, and a lower portion of the dummy light emitting layer extends inside the recessed portion.

According to at least one embodiment, the organic EL display panel further includes first banks defining the light emitting layers and second banks defining the dummy light emitting layer, wherein height of the second banks from the substrate is greater than height of the first banks from the substrate.

According to at least one embodiment, the dummy light emitting layer is provided in plurality, and area occupied by each of the dummy light emitting layers on the substrate is greater than area occupied by each of the light emitting layers on the substrate.

According to at least one embodiment, the dummy light emitting layer is provided in plurality, and each of the dummy light emitting layers corresponds to a defined number of light emitting layers.

According to at least one embodiment, the recessed portion forms a loop-shaped groove surrounding the light emitting region.

A method pertaining to at least one aspect of the present disclosure is a method of manufacturing an organic EL display panel including an element array above a substrate, the element array including a light emitting region and a peripheral region that does not emit light surrounding the light emitting region. The method includes preparing a substrate, forming a planarizing layer, forming light emitting layers, and forming a dummy light emitting layer. The planarizing layer is formed so as to be disposed between the substrate and the element array, covering the substrate. The light emitting layers are formed in the element array in the light emitting region and include organic light emitting material. A portion of the planarizing layer corresponding to the peripheral region of the element array is recessed, and the dummy light emitting layer including organic light emitting material is disposed above the recessed portion so that the organic light emitting material of the dummy light emitting layer extends into the recessed portion.

According to these aspects of the present disclosure, a significant effect is achieved of narrowing a peripheral region including a dummy pixel that does not contribute to light emission in order to suppress device enlargement, while holding liquid ink in the peripheral ink for the dummy pixel in order to increase uniformity of liquid ink evaporation in a central portion and peripheral portions of a light emitting region in which pixels that do contribute to light emission are arranged in a matrix of rows and columns.

2.1. Circuit Configuration of Organic EL Display Device 1

The following describes circuit configuration of an organic EL display device 1 according to at least one embodiment of the present disclosure.

The organic EL display device 1, as illustrated in FIG. 1, includes an organic EL display panel 10 and drive control circuitry 20 connected to the organic EL display panel 10.

The organic EL display panel 10 is a display panel that makes use of electroluminescence of organic material, and in the organic EL display panel 10 a plurality of organic EL elements are, for example, arranged in a matrix. Further, the drive control circuitry 20 includes four drive circuits 21-24 and a control circuit 25.

In the organic EL display device 1, arrangement of each circuit of the drive control circuitry 20 relative to the organic EL display panel 10 is not limited to that illustrated in FIG. 1.

2.2. Configuration of Organic EL Display Panel 10

According to at least one embodiment, the organic EL display panel 10 has a top-emission configuration in which organic EL elements 100 arranged in a matrix on a substrate (thin film transistor (TFT) substrate) 100*x* including thin film transistors emit light from an upper surface.

Figure 2:
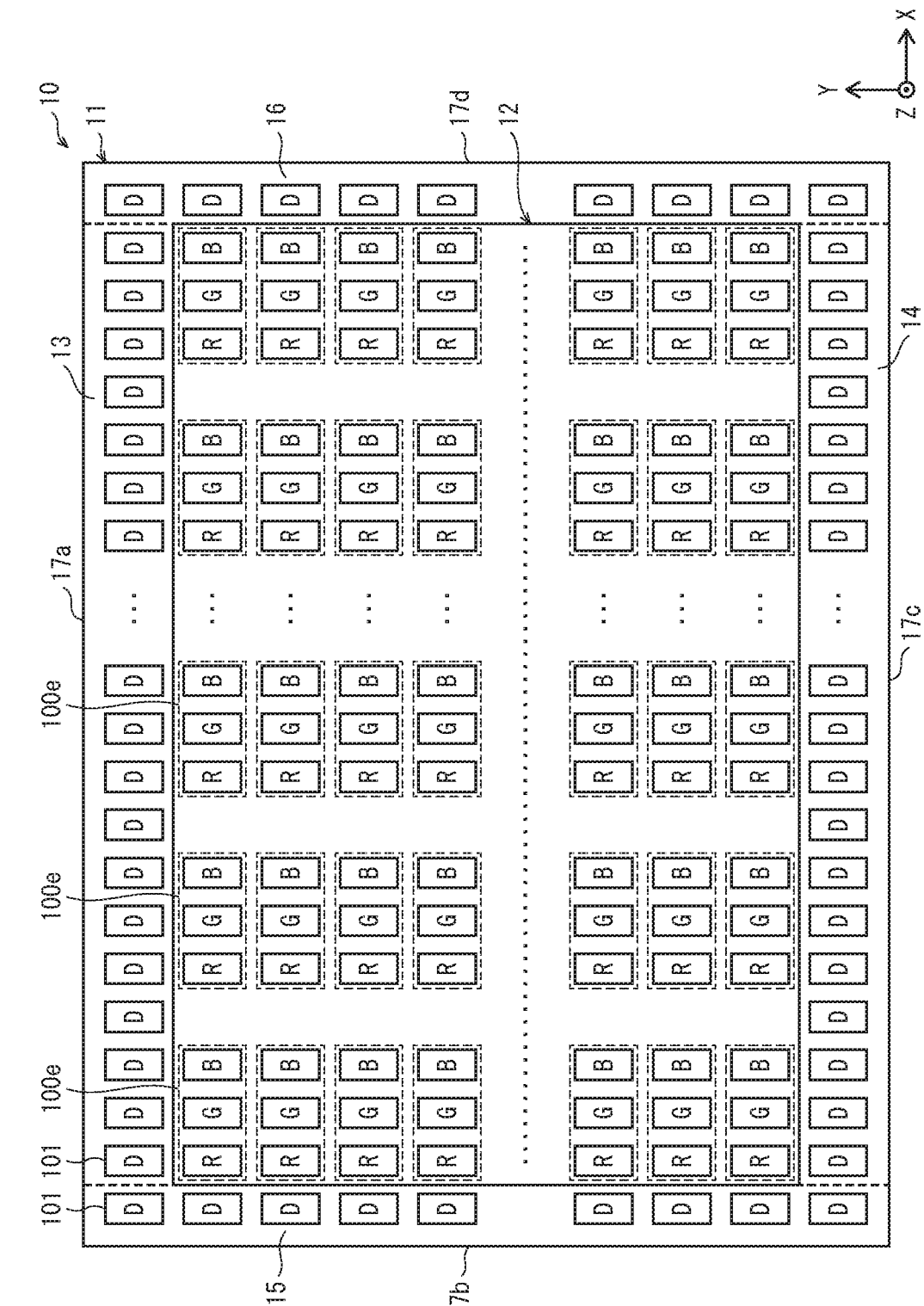
FIG. 2 is a schematic plan view diagram illustrating arrangement of a light emitting region 12 and a peripheral region 11 in an organic EL display panel 10 according to at least one embodiment.

In FIG. 2, the organic EL display panel 10 has an element array including a substantially rectangular light emitting region 12 and a frame-shaped peripheral region 11 surrounding the light emitting region 12. In the present description, the X direction, Y direction, and Z direction illustrated in FIG. 2 correspond to a row direction, column direction, and thickness direction of the organic EL display panel 10.

Unit pixels 100*e* are arranged in a matrix along the row and column directions in the light emitting region 12. Each of the unit pixels 100*e* includes three organic EL elements corresponding to three subpixels 100*se* emitting red (R), green (G), and blue (B) light, respectively. A region in which a subpixel is disposed is called a pixel region. Where the subpixels 100*se* are distinguished by color, they are also referred to as "blue subpixel 100*se*B", "green subpixel 100*se*G", and "red subpixel 100*se*R". In this way, in the light emitting region 12, subpixels contributing to light emission are arranged in a matrix along the row and column directions. Further, the light emitting region 12 includes three types of self-light-emitting regions 100*a*, a red light self-light-emitting region 100*a*R, a green light self-light-emitting region 100*a*G, and a blue light self-light-emitting region 100*a*B (see FIG. 4). Where the self-light-emitting regions 100*a*R, 100*a*G, 100*a*B are not distinguished from each other, they are referred to as self-light-emitting regions 100*a*. Three subpixels 100*se* corresponding to self-light-emitting regions 100*a*R, 100*a*G, 100*a*B constitute one set, and constitute one of the unit pixels 100*e* in a color display.

The peripheral region 11 surrounds the light emitting region 12 and does not contribute to light emission. The peripheral region 11 includes peripheral row regions 13, 14 and peripheral column regions 15, 16. The peripheral region 11 has a frame shape such that the peripheral row regions 13, 14 and the peripheral column regions 15, 16 surround four sides of the light emitting region 12. Each of the peripheral row regions 13, 14 has a band shape extending in the row direction and is disposed so as to contact an outer edge in the column direction of the light emitting region 12. Each of the peripheral column regions 15, 16 has a band shape extending in the column direction and is disposed so as to contact an outer edge in the row direction of the light emitting region 12.

A plurality of dummy pixels 101 are disposed in a line in the row direction in the peripheral row regions 13, 14. Specifically, in the peripheral row regions 13, 14, dummy pixels are disposed along the row direction corresponding to the red subpixels 100*se*R, the green subpixels 100*se*G, and the blue subpixels 100*se*B. Further, dummy pixels are disposed corresponding to gaps between the blue subpixels 100*se*B and the red subpixels 100*se*R.

A plurality of dummy pixels 101 are disposed in a line in the column direction in the peripheral column regions 15, 16. Specifically, in the peripheral column regions 15, 16, dummy pixels are disposed along the column direction corresponding to subpixels lined up in the row direction.

In other words, the dummy pixels 101 are arranged around outer edges of the four sides of the light emitting region 12. A region in which a dummy pixel is disposed is called a dummy pixel region.

A matrix of the unit pixels 100*e* and the dummy pixels 101 form an element array.

According to at least one embodiment, size of a dummy pixel region in which a dummy pixel is disposed is larger than a pixel region in which a subpixel is disposed.

The dummy pixels 101 are used for reducing unevenness in thickness of light emitting films between subpixels 100*se*, by reducing a difference in drying time of ink applied to light emitting layers of the subpixels 100*se* between subpixels 100*se* disposed in a central portion of the light emitting region 12 and subpixels 100*se* disposed in peripheral portions of the light emitting region 12. The dummy pixels 101 do not emit light.

Figure 3:
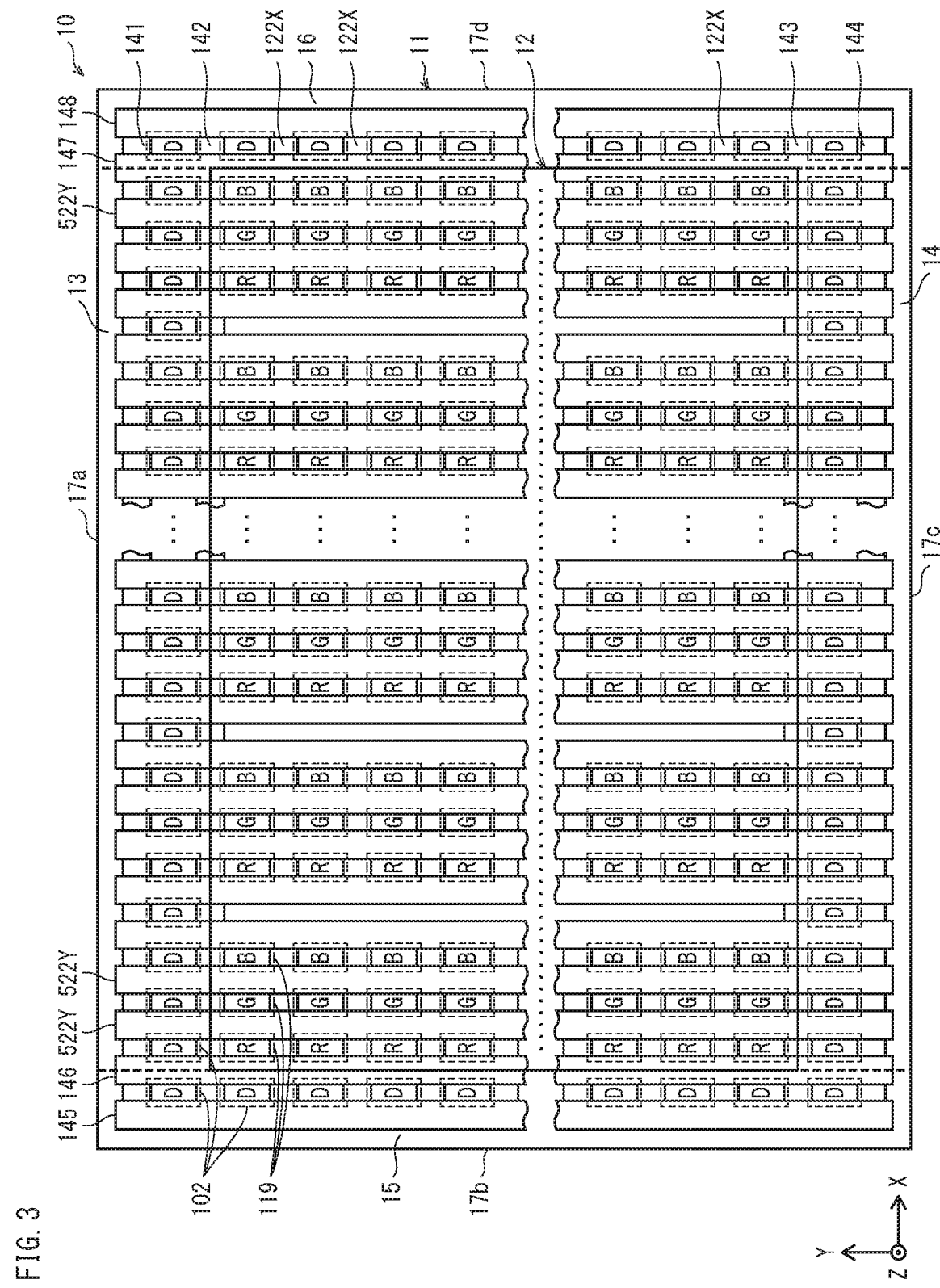
FIG. 3 is a schematic plan view diagram illustrating arrangement of pixel electrodes, column banks, and row banks in the organic EL display panel 10 according to at least one embodiment.

FIG. 3 illustrates arrangement of pixel electrodes, column banks, and row banks in the organic EL display panel 10 according to at least one embodiment. Further, FIG. 4 illustrates a corner enlargement of the organic EL display panel 10 in FIG. 3 according to at least one embodiment.

Figure 4:
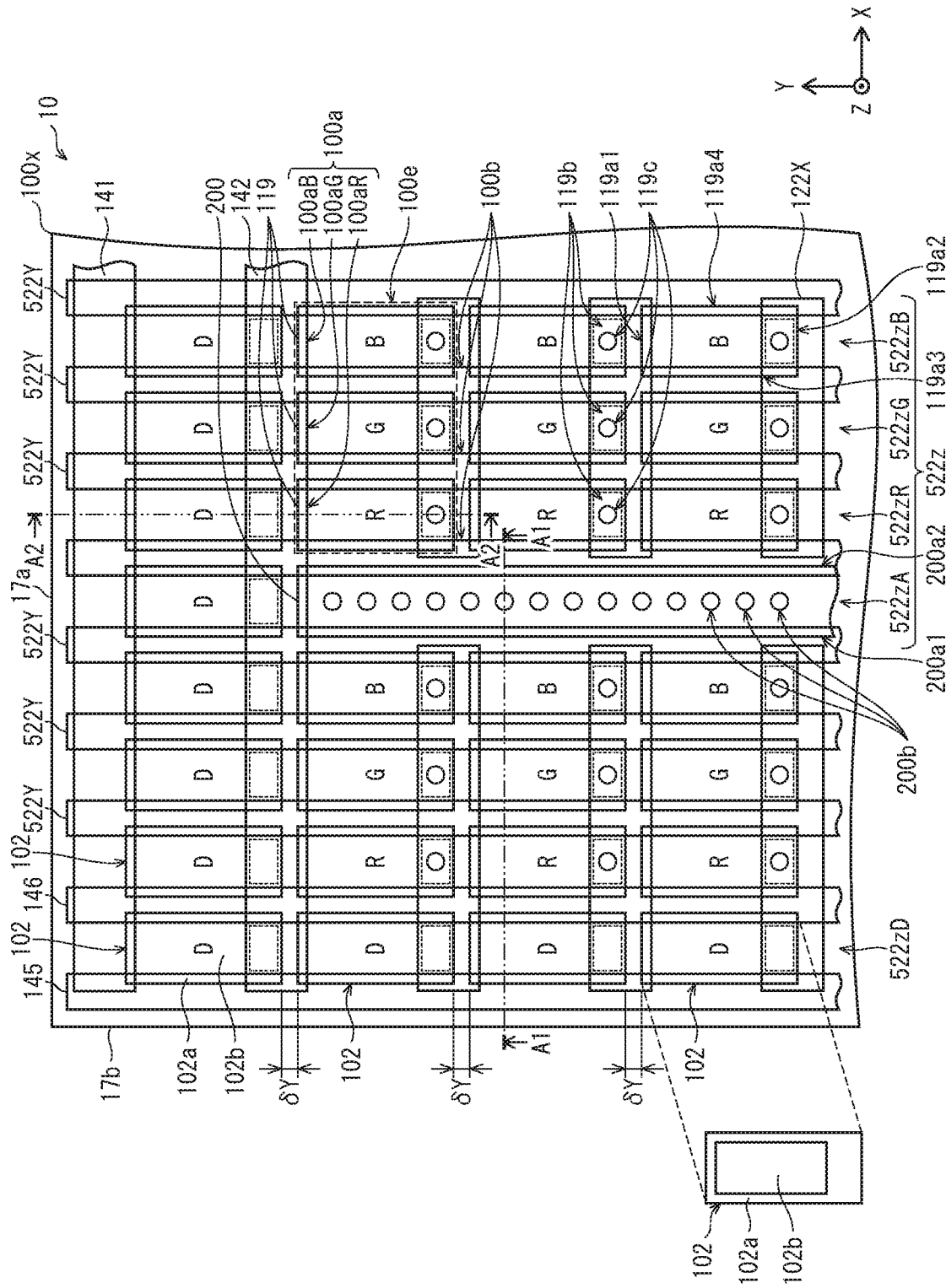
FIG. 4 is a schematic plan view illustrating a corner of the organic EL display panel 10 according to at least one embodiment.

In FIG. 3 and FIG. 4, in the light emitting region 12 of the organic EL display panel 10, pixel electrodes 119 are arranged in a matrix along the row and column directions on the substrate 100*x*. In the organic EL display panel 10 according to at least one embodiment, auxiliary electrode layers 200 are continuous in the column direction between the unit pixels 100*e* on the substrate 100*x*.

Further, dummy pixel electrodes 102 are disposed corresponding to the dummy pixels 101 in the peripheral row regions 13, 14 and the peripheral column regions 15, 16 of the organic EL display panel 10. That is, a plurality of the dummy pixel electrodes 102 are disposed in a line in the row direction on the substrate 100*x* in the peripheral row regions 13, 14. Further, a plurality of the dummy pixel electrodes 102 are disposed in a line in the column direction on the substrate 100*x* in the peripheral column regions 15, 16. Note that all the dummy pixel electrodes 102 are not connected to other wiring and no electrical power is supplied to the dummy pixel electrodes 102.

Further, column banks 145, 146, column banks 522Y, and column banks 147, 148, each extending in the column direction, are arranged on the organic EL display panel 10. Further, row banks 141, 142, row banks 122X, and row banks 143, 144, each extending in the row direction, are arranged on the organic EL display panel 10.

In the organic EL display panel 10, the column banks 145, 146, 522Y, 147, 148 are perpendicular to the row banks 141, 142, 122X, 143, 144.

The pixel regions and the dummy pixel regions are defined by the column banks and the row banks.

Gaps 522*z* are defined between adjacent ones of the column banks 522Y. The gaps 522*z* include red gaps 522*z*R, green gaps 522*z*G, blue gaps 522*z*B, and auxiliary gaps 522*z*A. The self-light-emitting regions 100*a*R are present in the red gaps 522*z*R. The self-light-emitting regions 100*a*G are present in the green gaps 522*z*G. The self-light-emitting regions 100aB are present in the blue gaps 522zB. Dummy gaps 522zD are defined between the column bank 145 and the column bank 146, and between the column bank 147 and the column bank 148. Where the red gaps 522zR, the green gaps 522zG, the blue gaps 522zB, the auxiliary gaps 522zA, and the dummy gaps 522zD are not distinguished from each other, they may be referred to as "gaps 522z".

2.3. Circuit Configuration of Subpixels 100se

Circuit configuration of the subpixels 100se is described with reference to FIG. 5.

Figure 5:
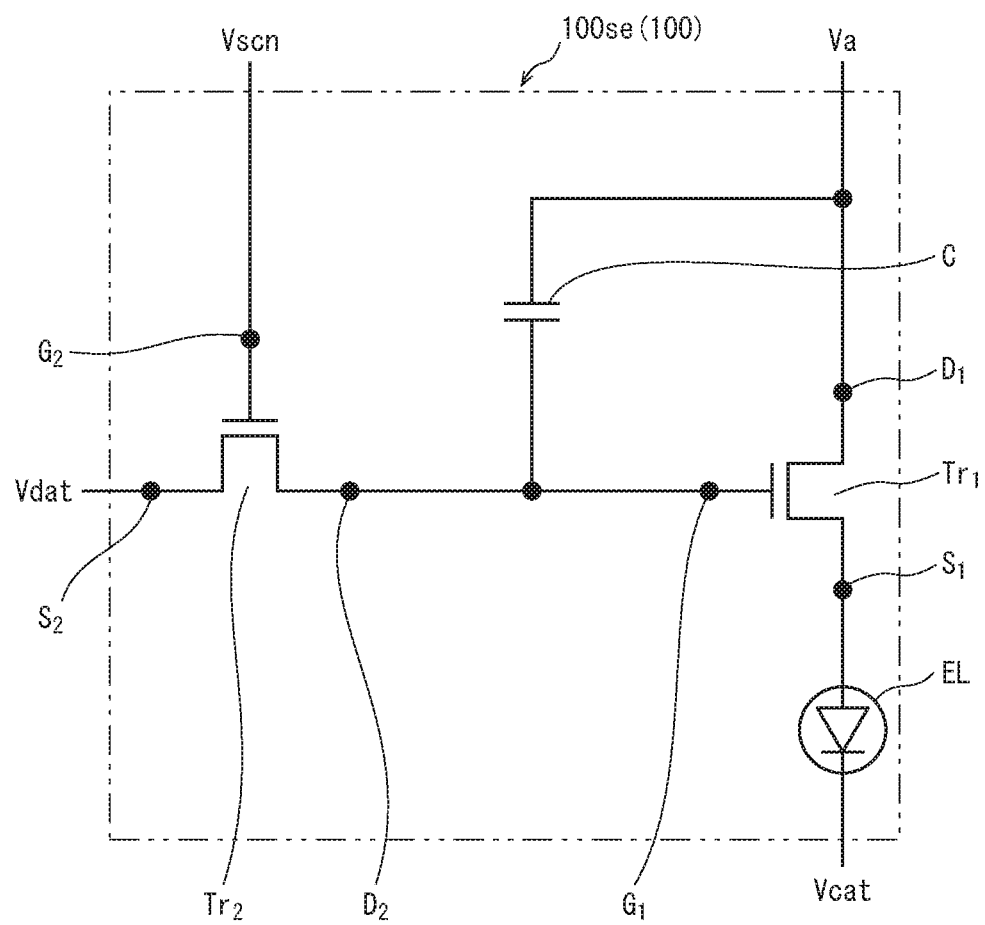
FIG. 5 is a circuit diagram illustrating a circuit configuration in each subpixel 100se of the organic EL display panel 10 according to at least one embodiment.

FIG. 5 is a circuit diagram illustrating a circuit configuration in an organic EL element 100 corresponding to each of the subpixels 100se of the organic EL display panel 10, according to at least one embodiment.

In FIG. 5, and according to the organic EL display panel 10 pertaining to at least one embodiment, the subpixel 100se includes transistors Tr1, Tr2, a capacitor C, and an organic EL element unit EL as a light emitting unit. The transistor Tr1 is a drive transistor, the transistor Tr2 is a switching transistor.

A gate G2 of the switching transistor Tr2 is connected to a scan line Vscn, and a source S2 is connected to a data line Vdat. A drain D2 of the switching transistor Tr2 is connected to a gate G1 of the drive transistor Tr1.

A drain D1 of the drive transistor Tr1 is connected to a power source line Va, and a source S1 is connected to a pixel electrode (anode) of the organic EL element unit EL. A common electrode layer (cathode) of the organic EL element unit EL is connected to a ground line Vcat.

A first end of the capacitor C is connected to the drain D2 of the switching transistor Tr2 and the gate G1 of the drive transistor Tr1, and a second end of the capacitor C is connected to the power source line Va.

For each of the subpixels 100se, a gate line leads out from the gate G2 and is connected to the scan line Vscn, which is connected outside the organic EL display panel 10. Similarly, for each of the subpixels 100se, a source line leads out from the source S2 and is connected to the data line Vdat, which is connected outside the organic EL display panel 10.

Further, the power source line Va and the ground line Vcat of each of the subpixels 100se are aggregated and connected to a power source line and a ground line, respectively, of the organic EL display device 1.

2.4. Configuration of Organic EL Display Panel 10

Figure 6:
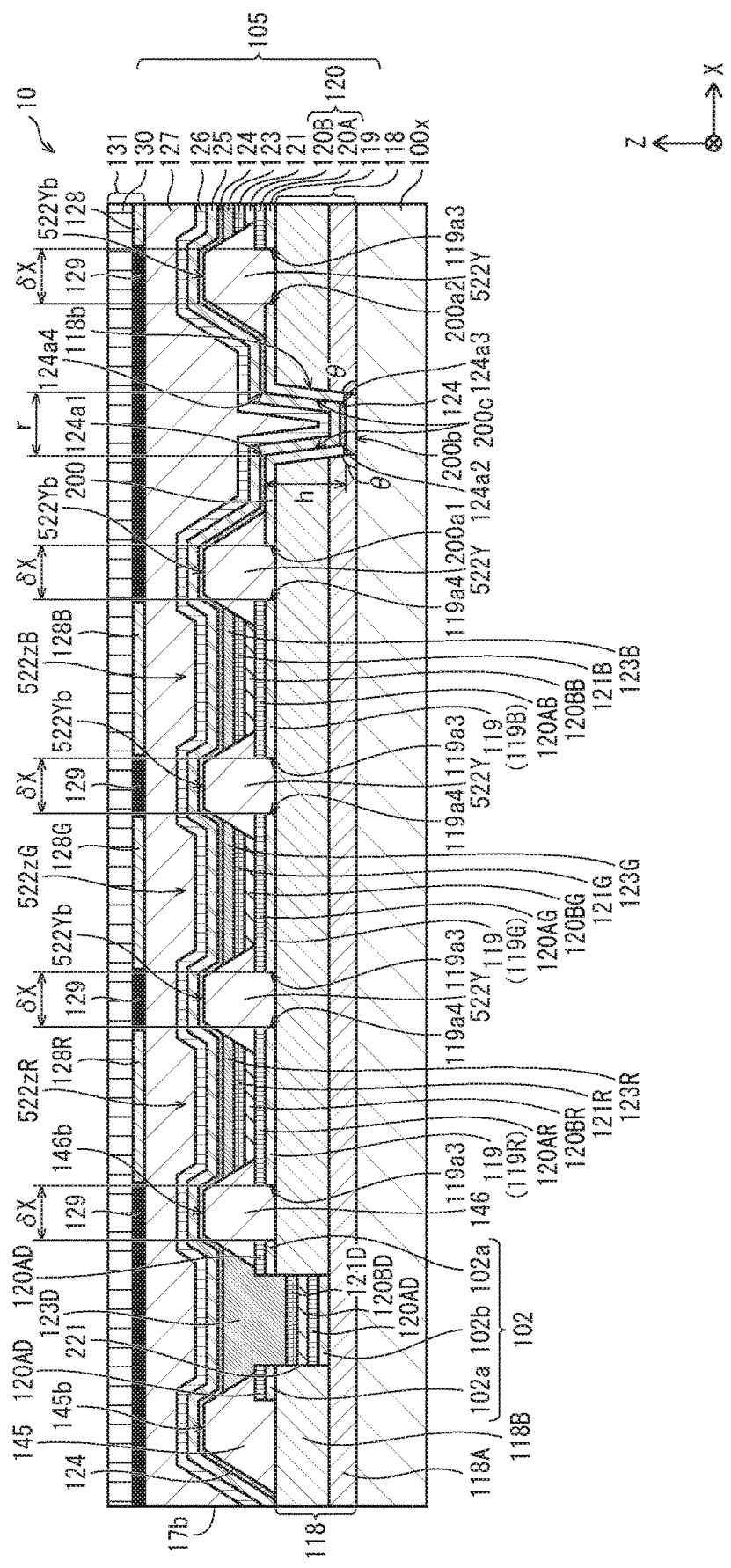
FIG. 6 is a cross-section diagram taken along A1-A1 of the organic EL display panel 10 according to at least one embodiment.
Figure 7:
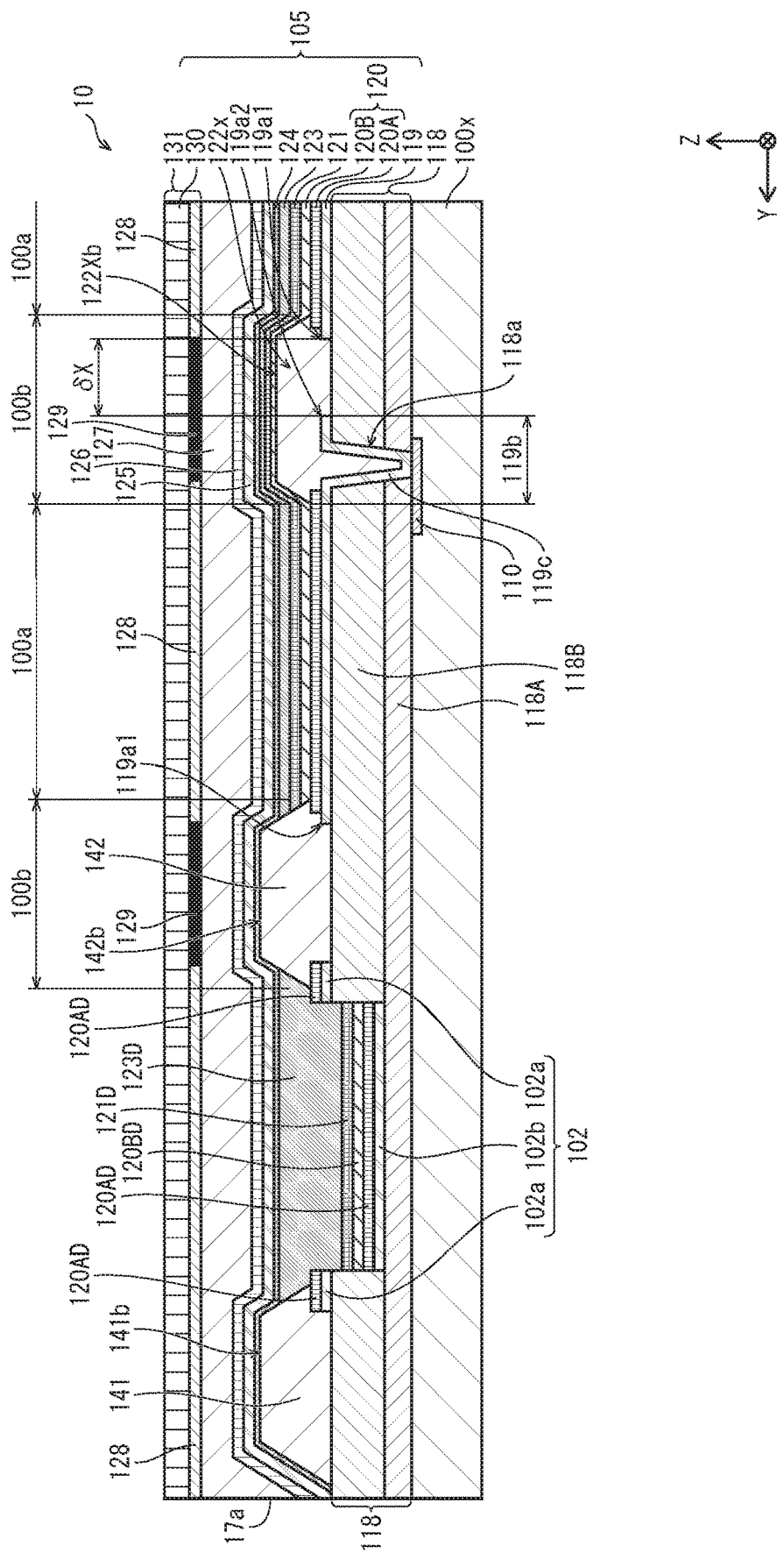
FIG. 7 is a cross-section diagram taken along A2-A2 of the organic EL display panel 10 according to at least one embodiment.

Configuration of the organic EL element 100 in the organic EL display panel 10 according to at least one embodiment is described with reference to FIG. 4, FIG. 6, and FIG. 7. FIG. 6 is a cross-section diagram of a cross-section taken along A1-A1. FIG. 7 is a cross-section diagram of a cross-section taken along A2-A2.

In the organic EL display panel 10 pertaining to at least one embodiment, in cross-section, the substrate (TFT substrate) 100x in which thin film transistors are formed is a lower layer in the Z axis direction, on which is an interlayer insulating layer 118, on which is an organic EL layer 105.

2.4.1. Substrate 100x and Interlayer Insulating Layer 118

(1) Substrate 100x

The substrate 100x includes a base (not illustrated) and a thin film transistor layer (not illustrated) on the base.

The base is a support member of the organic EL display panel 10, and has a flat shape. As a material of the base, an electrically insulative material can be used, such as a glass material, a resin material, a semiconductor material, a metal material coated with an insulating layer, or the like.

The TFT layer includes TFTs formed on the base and wiring including wiring 110 (see FIG. 7). In accordance from a drive signal from a circuit external to the organic EL display panel 10, a TFT electrically connects the pixel electrode 119 corresponding to the TFT and an external power source, and has a multilayer structure including an electrode, a semiconductor layer, and an insulating layer. Wiring is electrically connected to a TFT, the pixel electrode 119, the external power source, an external circuit, or the like. The wiring 110 is connected to the source S1 of the TFT.

(2) Interlayer Insulating Layer 118

The interlayer insulating layer 118 is disposed on a top surface of the substrate 100x including the TFT layer and the base. The interlayer insulating layer 118 disposed on the top surface of the substrate 100x planarizes the top surface of the substrate 100x that is uneven due to the TFT layer. Therefore, the interlayer insulating layer 118 can be defined as a planarization layer. Further, the interlayer insulating layer 118 fills between wiring and TFTs, and electrically insulates between wiring and TFTs. Further, the interlayer insulating layer 118 covers the substrate 100x, between the substrate 100x and an element array.

In FIG. 6 and FIG. 7, the interlayer insulating layer 118 includes a lower layer 118A and an upper layer 118B.

On a top surface of the lower layer 118A in the light emitting region 12 is disposed the upper layer 118B, and above the lower layer 118A in the peripheral region 11 are disposed electrodes 102b of dummy pixel electrodes 102, a lower layer 120AD of a hole injection layer 120, an upper layer 120BD of the hole injection layer 120, a hole transport layer 121D, and a light emitting layer 123D (dummy light emitting layer) in this order from the lower layer 118A. The lower layer 120AD, the upper layer 120BD, the hole transport layer 121D, and the light emitting layer 123D of the hole injection layer 120 are described later.

Further, in FIG. 6, a contact hole 118b is present in the interlayer insulating layer 118, and in FIG. 7, a contact hole 118a is present in a portion of the interlayer insulating layer 118 above the wiring 110. Further, in FIG. 6, a dummy pixel hole 221 is present in the interlayer insulating layer 118. A dummy pixel is formed in the dummy pixel hole 221.

According to at least one embodiment, depth of the dummy pixel hole 221 (distance from the top surface of the lower layer 118A of the interlayer insulating layer 118 to the top surface of the light emitting layer 123D) is from 5 μm to 8 μm, and length in the row direction and the column direction of a bottom surface of the dummy pixel hole 221 is from 100 μm to 300 μm and from 100 μm to 300 μm, respectively.

When the organic EL display panel 10 is manufactured, in a process of manufacturing light emitting layers and the like, liquid ink of an organic light emitting material is, for example, discharged and applied onto a substrate by using an inkjet method, and dried. When liquid ink lands in the dummy pixel hole 221, liquid ink is filled higher in dummy pixels than in subpixels contributing to light emission, and therefore according to at least one embodiment, size of the bottom surface of the dummy pixel hole 221 (length in the row direction and the column direction) is greater than size of the self-light-emitting region 100a of a subpixel (length in the row direction and the column direction). Further, volume of liquid ink above the dummy pixel hole 221 is greater than volume of liquid ink in the dummy pixel hole 221.

In a case in which film thickness of the interlayer insulating layer 118 is 10 μm or greater, film thickness variation during manufacture increases, and it becomes difficult to control bottom line width. From the viewpoint of productivity reduction due to tact increase, film thickness of the interlayer insulating layer 118 is 7 μm or less. As film thickness of the interlayer insulating layer 118 becomes thinner, it becomes necessary to make film thickness and bottom line width coincide, and when film thickness of the interlayer insulating layer 118 is 1 μm or less, it becomes difficult to achieve a desired bottom line width due to resolution limitations. In the case of a typical flat panel display, a lower limit of film thickness of the interlayer insulating layer 118 is 2 μm. Thus, according to at least one embodiment, film thickness of the interlayer insulating layer 118 is from 1 μm to 10 μm. Further, according to at least one embodiment, film thickness of the interlayer insulating layer 118 is from 2 μm to 7 μm.

2.4.2. Organic EL Layer 105

(1) Pixel Electrodes 119 and Dummy Pixel Electrodes 102

In FIG. 6 and FIG. 7, in the light emitting region 12, the pixel electrodes 119 are disposed in units of the subpixels 100se on the interlayer insulating layer 118 on the top surface of the substrate 100x. That is, on the interlayer insulating layer 118, in the light emitting region 12, corresponding to the subpixels 100se, the pixel electrodes 119 are disposed in a matrix, separated from each other by a defined distance in the row direction and in the column direction. The pixel electrodes 119 are for supplying carriers to the light emitting layers 123, and in a case in which the pixel electrodes 119 function as anodes, for example, supply holes to the light emitting layers 123. Further, according to at least one embodiment, the organic EL display panel 10 is a top-emission panel, and therefore the pixel electrodes 119 include light reflective material and are light reflective. In plan view, according to at least one embodiment, each of the pixel electrodes 119 is a flat shape having a substantially rectangular shape.

Three of the pixel electrodes 119 lined up in the row direction correspond to three self-light-emitting regions 100aR, 100aG, 100aB lined up in the row direction. The pixel electrodes 119 corresponding to the three self-light-emitting regions 100aR, 100aG, 100aB can also be referred to as pixel electrodes 119R, 119G, 119B, when distinguished by color.

Regions in which the pixel electrodes 119 are disposed are defined by ends 119a3 and ends 119a4 in the row direction and ends 119a1 and ends 119a2 in the column direction (FIG. 4).

The pixel electrodes 119 are disposed separated from each other in the row direction by a defined distance 6X (FIG. 6).

In the red gaps 522zR, the green gaps 522zG, and the blue gaps 522zB, adjacent ones of the pixel electrodes 119 in the column direction are disposed on the interlayer insulating layer 118 separated from each other by a defined distance 6Y (FIG. 4).

For each of the pixel electrodes 119, a connecting concavity 119c of the pixel electrode 119, which is a part of the pixel electrode 119 recessed in the thickness direction of the substrate 100x, is disposed above the contact hole 118a of the interlayer insulating layer 118, and a bottom of the connecting concavity 119c connects the pixel electrode 119 to the wiring 110 (FIG. 7).

Further, as described above, the dummy pixel electrodes 102 are disposed corresponding to the dummy pixels 101 in the peripheral row regions 13, 14 and the peripheral column regions 15, 16 of the organic EL display panel 10 (FIG. 2).

In FIG. 4, FIG. 6, and FIG. 7, the dummy pixel electrodes 102 include electrodes 102a and electrodes 102b. The electrodes 102a each have a frame shape and the electrodes 102b each have, for example, a substantially rectangular shape. The electrodes 102a are disposed on a top surface of the upper layer 118B of the interlayer insulating layer 118 in the peripheral region 11, and the electrodes 102b are disposed on a top surface of the lower layer 118A of the interlayer insulating layer 118 in the peripheral region 11.

The pixel electrodes 119 and the electrodes 102a of the dummy pixel electrodes 102 adjacent to the pixel electrodes 119 in the row direction are disposed separated from each other by a defined distance 6X (FIG. 6).

The pixel electrodes 119 and the electrodes 102a of the dummy pixel electrodes 102 adjacent to the pixel electrodes 119 in the column direction are disposed separated from each other by a defined distance 6Y (FIG. 4).

According to at least one embodiment, thickness of the pixel electrodes 119 and the dummy pixel electrodes 102 is approximately 0.2 μm.

(2) Auxiliary Electrode Layer 200

In FIG. 4 and FIG. 6, the auxiliary electrode layers 200 are disposed on the interlayer insulating layer 118 on the substrate 100x, to be continuous in the column direction between the unit pixels 100e.

The auxiliary electrode layers 200 include the same light reflective material as the light reflective material of the pixel electrodes 119.

Regions in which the auxiliary electrode layers 200 are disposed are defined by outer edges 200a1 and outer edges 200a2 in the row direction (FIG. 4).

The auxiliary electrode layers 200 are disposed separated from the pixel electrodes 119 that are adjacent to the auxiliary electrode layers 200 in the row direction by a defined distance 6X (FIG. 6).

Connecting concavities 200b are formed in the auxiliary electrode layers 200 that connect the auxiliary electrode layers 200 and a common electrode layer 125. The connecting concavities 200b are portions of the auxiliary electrode layers 200 recessed in the thickness direction of the substrate 100x along the contact holes 118b of the interlayer insulating layer 118. Contact surfaces 200c are inner walls inside the connecting cavities 200b. The connecting cavities 200b each have a substantially circular shape and have a diameter r that is from 2 μm to 10 μm according to at least one embodiment. Further, height h of each of the connecting cavities 200b is from 1 μm to 7 μm according to at least one embodiment. Further, the contact surfaces 200c have an inclination angle θ relative to the top surface of the substrate 100x in a range of 75 degrees to 120 degrees according to at least one embodiment.

According to at least one embodiment, thickness of the auxiliary electrode layer 200 is approximately 0.2 μm.

(3) Hole Injection Layers 120

In FIG. 6 and FIG. 7, the hole injection layers 120 are disposed on the pixel electrodes 119. The hole injection layers 120 have a function of transporting holes injected from the pixel electrodes 119 to the hole transport layers 121.

Each of the hole injection layers 120 includes, in order from the substrate 100x, a lower layer 120A including a metal oxide formed on the pixel electrodes 119, and at least an upper layer 120B including an organic material layered on the lower layer 120A. The lower layers 120A disposed in the blue subpixels, green subpixels, and red subpixels are also referred to as lower layers 120AB, lower layers 120AG, and lower layers 120AR, respectively. Further, the upper layers 120B disposed in the blue subpixels, green subpixels, and red subpixels are also referred to as upper layers 120BB, upper layers 120BG, and upper layers 120BR, respectively.

Further, the lower layers 120A in the peripheral region 11 are also referred to as lower layers 120AD, and the upper layers 120B in the peripheral region 11 are also referred to as upper layers 120BD.

According to at least one embodiment, the upper layers 120B in the red gaps 522zR, the green gaps 522zG, and the blue gaps 522zB are disposed linearly extending in the column direction. However, according to at least one embodiment, the upper layers 120B are disposed only on the lower layers 120A formed on the pixel electrodes, and are discrete in the column direction in the gaps 522z.

(4) Banks 122
(Overview)

In FIG. 6 and FIG. 7, banks including insulating material are disposed covering ends of the pixel electrodes 119, the electrodes 102a of the dummy pixel electrodes 102, the lower layers 120A of the hole injection layers 120, and the auxiliary electrode layers 200.

As described above, the column banks 145, 146, the column banks 522Y, and the column banks 147, 148, each extending in the column direction, are arranged on the organic EL display panel 10. Further, the row banks 141, 142, the row banks 122X, and the row banks 143, 144, each extending in the row direction, are arranged on the organic EL display panel 10.

In the organic EL display panel 10, the column banks 145, 146, 522Y, 147, 148 are perpendicular to the row banks 141, 142, 122X, 143, 144. The column banks 145, 146, 522Y, 147, 148 and the row banks 141, 142, 122X, 143, 144 form a lattice-like shape.

Where the column banks 145, 146, 522Y, 147, 148 and the row banks 141, 142, 122X, 143, 144 are not distinguished, they are also referred to as "banks 122".

The self-light-emitting regions 100a are located between adjacent ones of the row banks 122X in the column direction and between adjacent ones of the column banks 522Y in the row direction. In this way, the row banks 122X and the column banks 522Y form apertures corresponding to the self-light-emitting regions 100a.

Note that the self-light-emitting regions 100a adjacent to ends of the light emitting regions 12 in the column direction are located between one of the row banks 122X and the row bank 142 that is adjacent thereto, and between one of the row banks 122X and the row bank 143 that is adjacent thereto, and the self-light-emitting regions 100a adjacent to ends of the light emitting regions 12 in the row direction are located between the one of the column banks 522Y and the column bank 146 that is adjacent thereto and between one of the column banks 522Y and the column bank 147 that is adjacent thereto. In this way, the row banks 122X, the row bank 142, the row bank 143, the column banks 522Y, the column bank 146, and the column bank 147 form openings corresponding to self-light-emitting regions 100a adjacent to ends of the light emitting regions 12.

In the peripheral row region 13, the dummy pixel regions are disposed between the row banks 141, 142, and in the row direction disposed between the column bank 146 and an adjacent one of the column banks 522Y, between adjacent ones of the column banks 522Y, and between one of the column banks 522Y and the column bank 147 adjacent thereto.

In the peripheral row region 14, the dummy pixel regions are disposed between the row banks 143, 144, and in the row direction disposed between the column bank 146 and one of the column banks 522Y adjacent thereto, between adjacent ones of the column banks 522Y, and between one of the column banks 522Y and the column bank 147 adjacent thereto.

In the peripheral column region 15, the dummy pixel regions are disposed between the column banks 145, 146, and in the column direction disposed between the row banks 141, 142, between the row bank 142 and an adjacent one of the row banks 122X, between adjacent ones of the row banks 122X, between one of the row banks 122X and the row bank 143 adjacent thereto, and between the row banks 143, 144.

In the peripheral column region 16, the dummy pixel regions are disposed between the column banks 147, 148, and in the column direction disposed between the row banks 141, 142, between the row bank 142 and one of the row banks 122X adjacent thereto, between adjacent ones of the row banks 122X, between one of the row banks 122X and the row bank 143 adjacent thereto, and between the row banks 143, 144.

In this way, openings are formed corresponding to the dummy pixel regions.

(Arrangement of Column Banks 522Y)

In the light emitting region 12 and the peripheral region 11, between the auxiliary electrode layers 200 and the pixel electrodes 119 adjacent thereto in the row direction, the column banks 522Y that are insulating layers extending in the column direction are disposed on the interlayer insulating layer 118, above the outer edge 200a2 (or 200a1) of the auxiliary electrode layer 200, and above the outer edge 119a3 (or 119a4) of the pixel electrodes 119. The column banks 522Y insulate the auxiliary electrode layers 200 and the pixel electrodes 119 adjacent thereto in the row direction from each other. The column banks 522Y extend between the dummy pixel electrodes 102 in the same column as the auxiliary electrode layers 200 and the dummy pixel electrodes 102 in the same column as the pixel electrodes 119.

In the light emitting region 12 and the peripheral region 11, between pixel electrodes 119 (first pixel electrodes) and pixel electrodes 119 (second pixel electrodes) adjacent thereto in the row direction, the column banks 522Y, which are insulating layers extending in the column direction, are disposed on the interlayer insulating layer 118, above the outer edges 119a4 of the first pixel electrodes, and above the outer edges 119a3 of the second pixel electrodes. The column banks 522Y insulate the first pixel electrodes and the second pixel electrodes adjacent thereto in the row direction from each other. The column banks 522Y extend between the dummy pixel electrodes 102 in the same column as the first pixel electrodes and the dummy pixel electrodes 102 in the same column as the second pixel electrodes.

In this way, a plurality of sets composed of one of the column banks 522Y and one of the gaps 522z are arranged side by side in the row direction. Further, in the red gaps 522zR, in the green gaps 522zG, and in the blue gaps 522zB, a plurality of sets composed of one of the self-light-emitting regions 100a and one of the non-self-light-emitting regions 100b are arranged side by side in the column direction.

(Arrangement of Column Banks 145-148)

In the peripheral column region 15, along an outer edge 17b of the organic EL display panel 10, the column bank 145, which is an insulating layer extending in the column direction, is disposed on the interlayer insulating layer 118 and above outer edges of the electrodes 102a of the dummy pixel electrodes 102.

In the light emitting region 12 and in the peripheral region 11, between the dummy pixel electrodes 102 disposed in a column in the peripheral column region 15, and the dummy pixel electrodes 102 and the pixel electrodes 119 adjacent in the row direction to the dummy pixel electrodes 102, the column bank 146, which is an insulating layer that extends in the column direction, is disposed on the interlayer insulating layer 118, above outer edges of the electrodes 102*a* of the dummy pixel electrodes 102, and above the outer edges 119*a*3 of the pixel electrodes 119.

In the peripheral column region 16, along an outer edge 17*d* of the organic EL display panel 10, the column bank 148, which is an insulating layer extending in the column direction, is disposed on the interlayer insulating layer 118 and above outer edges of the electrodes 102*a* of the dummy pixel electrodes 102.

In the light emitting region 12 and in the peripheral region 11, between the dummy pixel electrodes 102 disposed in a column in the peripheral column region 16, and the dummy pixel electrodes 102 and the pixel electrodes 119 adjacent in the row direction to the dummy pixel electrodes 102, the column bank 147, which is an insulating layer that extends in the column direction, is disposed on the interlayer insulating layer 118, above outer edges of the electrodes 102*a* of the dummy pixel electrodes 102, and above the outer edges 119*a*4 of the pixel electrodes 119.

(Structures of the Column Banks 522Y, 145-148)

The column banks 522Y, 145-148 each extend in the column direction. Further, cross-sections of the column banks 522Y, 145-148 taken along the row direction are tapered trapezoidal shapes that taper upwards.

(Relationship Between Column Banks 522Y and Self-Light-Emitting Regions)

The column banks 522Y define outer edges in the row direction of the self-light-emitting regions 100*a*R of the red subpixels 100*se*R, define outer edges in the row direction of the self-light-emitting regions 100*a*G of the green subpixels 100*se*G, and define outer edges in the row direction of self-light-emitting regions 100*a*B of the blue subpixels 100*se*B.

The column bank 146 defines outer edges in the row direction of the self-light-emitting regions 100*a*R of the red subpixels 100*se*R, and the column bank 147 defines outer edges in the row direction of the self-light-emitting regions 100*a*B of the blue subpixels 100*se*B.

Thus, the column banks 522Y, the column bank 146, and the column bank 147 define outer edges of self-light-emitting regions of pixels in the row direction.

(Function of the Column Banks 522Y, 145-148)

The column banks 522Y, the column bank 146, and the column bank 147 block flow in the row direction of ink including an organic compound that is a material of the light emitting layers 123, and define outer edges in the row direction of the light emitting layers 123 when formed.

Further, the column banks 145-148 block flow in the row direction of ink including an organic compound that is a material of the light emitting layers 123 of the dummy pixel regions, and define outer edges in the row direction of the dummy pixel regions when formed.

The column banks 145, 146 and the column banks 147, 148 form openings corresponding to the dummy pixel regions.

In regions where the column banks 522Y, 146, 147 are present, the pixel electrodes 119 are not exposed by the column banks 522Y, 146, 147 and the regions do not contribute to light emission.

The column banks 522Y, 146, 147 cover the outer edges 119*a*3, 119*a*4 in the row direction of the pixel electrodes 119. Thus, electrical leaks are suppressed between the pixel electrodes 119 and the common electrode layer 125.

(Arrangement of Row Banks 122X)

In the light emitting region 12 and the peripheral region 11, between pixel electrodes 119 (third pixel electrodes) and pixel electrodes 119 (fourth pixel electrodes) adjacent thereto in the column direction, the row banks 122X, which are insulating layers extending in the row direction, are disposed on the interlayer insulating layer 118, above the outer edges 119*a*2 of the third pixel electrodes, and above the outer edges 119*a*1 of the fourth pixel electrodes. The row banks 122X insulate the third pixel electrodes and the fourth pixel electrodes adjacent thereto in the column direction from each other. The row banks 122X extend between the dummy pixel electrodes 102 in the same row as the third pixel electrodes and the dummy pixel electrodes 102 in the same row as the fourth pixel electrodes.

(Arrangement of Row Banks 141-144)

In the peripheral row region 13, along an outer edge 17*a* of the organic EL display panel 10, the row bank 141, which is an insulating layer extending in the row direction, is disposed on the interlayer insulating layer 118 and above outer edges of the electrodes 102*a* of the dummy pixel electrodes 102.

In the light emitting region 12 and in the peripheral region 11, between the dummy pixel electrodes 102 disposed in a row in the peripheral row region 13, and the dummy pixel electrodes 102 and the pixel electrodes 119 adjacent thereto in the column direction, the row bank 142, which is an insulating layer that extends in the row direction, is disposed on the interlayer insulating layer 118, above outer edges of the electrodes 102*a* of the dummy pixel electrodes 102, and above the outer edges 119*a*1 of the pixel electrodes 119.

In the peripheral row region 14, along an outer edge 17*c* of the organic EL display panel 10, the row bank 144, which is an insulating layer extending in the row direction, is disposed on the interlayer insulating layer 118 and above outer edges of the electrodes 102*a* of the dummy pixel electrodes 102.

In the light emitting region 12 and in the peripheral region 11, between the dummy pixel electrodes 102 disposed in a row in the peripheral row region 14, and the dummy pixel electrodes 102 and the pixel electrodes 119 adjacent in the column direction to the dummy pixel electrodes 102, the row bank 143, which is an insulating layer that extends in the row direction, is disposed on the interlayer insulating layer 118, above the outer edges of the electrodes 102*a* of the dummy pixel electrodes 102, and above the outer edges 119*a*2 of the pixel electrodes 119.

(Structure of Row Banks 122X, 141-144)

The row banks 122X, 141-144 each extend in the row direction. Further, cross-sections of the row banks 122X, 141-144 taken along the column direction are tapered trapezoidal shapes that taper upwards. The row banks 122X, 141-144 are perpendicular to the column direction so as to pass through the column banks 522Y, 145, 146, 147, 148.

(Bank Height and Width)

Height (H1) of the column banks 522Y, 145-148 and the row banks 141-144 from the top surface of the interlayer insulating layer 118 is the same. Further, height (H2) of all of the row banks 122X from the top surface of the interlayer insulating layer 118 is the same.

According to at least one embodiment, H1>H2. That is, height H2 of the row banks 122X is lower than height H1 of the column banks 522Y, 145-148 and the row banks 141-144.

Thus, flow of ink including an organic compound as material of the light emitting layers 123 in the row direction is blocked, and flow of the ink in the column direction is controlled.

According to at least one embodiment, height of the column banks 522Y, 145-148 and the row banks 141-144 from the top surface of the interlayer insulating layer 118 is 1 µm. Further, according to at least one embodiment, height of the row banks 122X from the top surface of the interlayer insulating layer 118 is 0.5 µm.

Further, according to at least one embodiment, width at the base of the column banks 522Y, the row banks 122X, the column banks 145-148, and the row banks 141-144 is the same, and is from 15 µm to 20 µm.

(Relationship Between Row Banks 122X and Self-Light-Emitting Regions)

Regions where the row banks 122X are present do not emit electroluminescent light from the light emitting layers 123 above the pixel electrodes 119, and are therefore non-self-light-emitting regions 100b. Thus, outer edges of the self-light-emitting regions 100a in the column direction are defined by outer edges of the row banks 122X in the column direction.

(Function of Row Banks 122X, 141-144)

Pixel electrodes 119 that are adjacent to each other in the column direction are insulated from each other by the row banks 122X.

The row banks 122X for controlling flow in the column direction of ink including an organic compound that is material of the light emitting layers 123. In the row banks 122X, lyophilicity with respect to the ink is equal to or greater than a defined value. According to this configuration, variation in ink amounts applied between subpixels is suppressed.

Further, the row banks 141-144 block flow in the column direction of ink including an organic compound that is a material of the light emitting layers 123 of the dummy pixel regions, and define outer edges in the column direction of the dummy pixel regions when formed.

In regions where the row banks 122X are present, the pixel electrodes 119 are not exposed by the row banks 122X and the regions do not contribute to light emission.

Length in the column direction of the non-self-light-emitting regions 100b in which the row banks 122X are present is a defined length greater than a distance δY between the outer edges 119a1 and the outer edges 119a2 in the column direction of the pixel electrodes 119 that are adjacent to each other. Thus, the row banks 122X suppress electrical leaks between the pixel electrodes 119 and the common electrode layer 125 by covering the outer edges 119a1, 119a2 in the column direction of the pixel electrodes 119.

Further, the row banks 122X define outer edges of the self-light-emitting regions 100a of the subpixels 100se in the column direction.

(Electrical Connection)

In FIG. 7, in the non-self-light-emitting regions 100b in which the row banks 122X are present, there are the connecting cavities 119c (contact holes) in the interlayer insulating layer 118 that connect the pixel electrodes 119 to the sources S1 of the TFTs, and contact regions 119b (contact windows) of the pixel electrodes 119 for electrical connectivity of the pixel electrodes 119.

(5) Hole Transport Layers 121

In FIG. 6 and FIG. 7, the hole transport layers 121 are layered on the hole injection layers 120 on the row banks 122X and in the gaps 522zR, 522zG, 522zB. The hole transport layers 121 are in contact with the upper layers 120B of the hole injection layers 120. The hole transport layers 121 have a function of transporting holes injected from the hole injection layers 120 to the light emitting layer 123. The hole transport layers 121 in the gaps 522zR, 522zG, and 522zB are also known as hole transport layers 121R, hole transport layers 121G, and hole transport layers 121B, respectively.

According to at least one embodiment, the hole transport layers 121 each have an elongate shape extending in the column direction in the gaps 522z, similarly to the upper layers 120B. However, according to at least one embodiment, the hole transport layers 121 are discontinuous in the column direction in the gaps 522z.

(6) Light Emitting Layers 123

In FIG. 6 and FIG. 7, in the light emitting regions 12, the light emitting layers 123 are layered on the hole transport layers 121. The light emitting layers 123 are layers including an organic compound and have a function of emitting light through recombination of holes and electrons in the light emitting layers 123. In the red gaps 522zR, the green gaps 522zG, and the blue gaps 522zB defined by column banks 522Y that are adjacent to each other, the column bank 146 and the column bank 522Y adjacent thereto, and the column bank 147 and the column bank 522Y adjacent thereto, the light emitting layers 123 each extend in the column direction. Light emitting layers 123R, 123G, 123B emitting corresponding colors are disposed in the red gaps 522zR corresponding to the self-light-emitting regions 100aR in the red subpixels 100seR, in the green gaps 522zG corresponding to the self-light-emitting regions 100aG in the green subpixels 100seG, and in the blue gaps 522zB corresponding to the self-light-emitting regions 100aB in the blue subpixels 100seB, respectively. According to at least one embodiment, film thickness of the light emitting layers 123R, 123G, 123B (after drying) is approximately 0.2 µm.

Only portions of the light emitting layers 123 to which carriers are supplied from the pixel electrodes 119 emit light, and therefore no electroluminescence of an organic compound occurs in a range in which the row banks 122X, which are insulators between layers, are present. Thus, only portions of the light emitting layers 123 where the row banks 122X are not present emit light, these portions are the self-light-emitting regions 100a, and edges in the column direction of the self-light-emitting regions 100a are defined by the row banks 122X.

Portions of the light emitting layers 123 above side surfaces and top surfaces 122Xb of the row banks 122X do not emit light, and these portions are the non-self-light-emitting regions 100b. The light emitting layers 123 are disposed on top surfaces of the hole transport layers 121 in the self-light-emitting regions 100a, and disposed on top surfaces of the hole transport layers 121 on top surfaces and side surfaces of the row banks 122X in the non-self-light-emitting regions 100b.

The light emitting layers 123 extend continuously not only in the self-light-emitting regions 100a but also across adjacent non-self-light-emitting regions 100b. In this way, when forming the light emitting layer 123, ink applied to the self-light-emitting regions 100a can flow in the column direction via ink applied to the non-self-light-emitting regions 100b and film thickness between pixels in the column direction can be equalized. However, in the non-self-light-emitting regions 100b, in flow is appropriately suppressed by the row banks 122X. Accordingly, it is unlikely that a large degree of film thickness unevenness occurs in the column direction, and luminance evenness is improved between pixels.

In FIG. 6 and FIG. 7, in the peripheral region 11, the light emitting layers 123 are layered on the hole transport layers 121. Where the light emitting layers 123 in the peripheral region 11 are distinguished from the light emitting layers 123 in the light emitting region 12, they are also referred to as light emitting layers 123D.

According to at least one embodiment, film thickness of the light emitting layers 123D (after drying) is approximately 0.4 µm or greater.

The light emitting layers 123D are used for reducing unevenness in thickness of light emitting films between subpixels 100se, by reducing a difference in drying time of ink applied to light emitting layers of the subpixels 100se between subpixels 100se disposed in a central portion of the light emitting region 12 and subpixels 100se disposed in peripheral portions of the light emitting region 12. The light emitting layers 123D do not contribute to light emission.

According to at least one embodiment, volume (after drying) of each one of the light emitting layers 123D is approximately ten times volume (after drying) of each one of the light emitting layers 123 of the subpixels 100se in the light emitting layer 12.

According to at least one embodiment, surface area occupied by each one of the light emitting layers 123D of the dummy pixels on the substrate 100x is greater than surface area occupied by each one of the light emitting layers 123 of subpixels on the substrate 100x.

(7) Electron Transport Layer 124

In FIG. 6 and FIG. 7, the electron transport layer 124 covers the column banks 522Y, 145-148 and the gaps 522z defined by these column banks. The electron transport layer 124 is continuous across the light emitting region 12 and the peripheral region 11 of the organic EL display panel 10.

In FIG. 6 and FIG. 7, the electron transport layer 124 is formed on the light emitting layers 123. The electron transport layer 124 has a function of transporting electrons from the common electrode layer 125 to the light emitting layers 123 and a function of limiting injection of electrons to the light emitting layers 123.

In FIG. 6, the electron transport layer 124 is also disposed on the auxiliary electrode layers 200. The electron transport layer 124 is absent in the connecting cavities 200b of the auxiliary electrode layers 200 (in FIG. 6, between ends 124a1, 124a2 and between ends 124a3, 124a4), and in portions where the electron transport layer 124 is absent, the contact surfaces 200c of the auxiliary electrode layers 200 are exposed.

(8) Common Electrode Layer 125

In FIG. 6 and FIG. 7, the common electrode layer 125 is disposed on the electron transport layer 124. The common electrode layer 125 is an electrode common to the light emitting layers 123.

In FIG. 6 and FIG. 7, the common electrode layer 125 is disposed on the electron transport layer 124 and in regions above the pixel electrodes 119. The common electrode layer 125 paired with the pixel electrodes 119 sandwich the light emitting layers 123, forming a conduction path, the common electrode layer 125 supplies carriers to the light emitting layers 123, and for example when the common electrode layer 125 functions as a cathode, the common electrode layer 125 supplies electrons to the light emitting layers 123.

In FIG. 6, the common electrode layer 125 is disposed on the electron transport layer 124 and in regions above the auxiliary electrode layers 200. The common electrode layer 125 directly contacts the contacts surfaces 200c exposed where the electron transport layer 124 is absent (between the ends 124a1, 124a2 and between the ends 124a3, 124a4).

(9) Sealing Layer 126

The sealing layer 126 covers the common electrode layer 125. The sealing layer 126 is for suppressing deterioration of the light emitting layers 123 due to contact with moisture, air, or the like. The sealing layer 126 covers a top surface of the common electrode layer 125.

(10) Joining Layer 127

A color filter substrate 131 is disposed above the sealing layer 126 in the Z axis direction and joined thereto by the joining layer 127. The color filter substrate 131 includes an upper substrate 130 and a color filter layer 128 below the upper substrate 130 in the Z axis direction. The joining layer 127 has a function of joining the color filter substrate 131 to a back panel composed of all layers from the substrate 100x to the sealing layer 126, and has a function of suppressing exposure of the layers to moisture and air.

(11) Upper Substrate 130

The color filter substrate 131 is disposed on and joined to the joining layer 127, the color filter substrate 131 including the upper substrate 130 and the color filter layer 128. According to at least one embodiment, the organic EL display panel 10 is a top-emission display panel and a light-transmissive material such as cover glass or light-transmissive resin film is used in the upper substrate 130. Further, the upper substrate 130 can improve rigidity of the organic EL display panel 10 and help prevent intrusion of moisture, air, and the like.

(12) Color Filter Layer 128

On the upper substrate 130, the color filter layer 128 is disposed in positions corresponding to the self-light-emitting regions 100a of each color of pixel. The color filter layer 128 is a light transmissive layer provided to transmit visible light of wavelengths corresponding to R, G, and B, and has a function of transmitting light emitted from each color of pixel and correcting chromaticity thereof. For example, according to at least one embodiment, red, green, and blue filter layers 128R, 128G, 128B are disposed above the self-light-emitting regions 100aR in the red gaps 522zR, the self-light-emitting regions 100aG in the green gaps 522zG, and the self-light-emitting regions 100aB in the blue gaps 522zB, respectively.

(13) Light Shielding Layer 129

The light shielding layer 129 is disposed in positions on the upper substrate 130 corresponding to boundaries between the self-light-emitting regions 100a of each pixel. The light shielding layer 129 is a black resin layer provided for blocking transmission of visible light of wavelengths corresponding to R, G, and B, and according to at least one embodiment includes a resin material including black pigment that excels in light absorption and light shielding.

2.4.3. Materials

Materials of elements illustrated in FIG. 4 to FIG. 7 are described below.

(1) Substrate 100x (TFT Substrate)

The base can be a glass substrate, a silicon substrate, a metal substrate including molybdenum sulfide, copper, zinc, aluminum, stainless steel, magnesium, iron, nickel, gold, silver, or the like, a semiconductor substrate including a gallium arsenic group or the like, a plastic substrate, or the like. As a plastic material that has flexibility, a thermoplastic resin or thermosetting resin may be used. As a material, an electrically insulating material such as a resin material can be used, for example. Known materials can be used for gate electrodes, gate insulating layers, channel layers, channel protection layers, source electrodes, drain electrodes, and the like included in TFTs. As a gate electrode, a laminate of copper (Cu) and molybdenum (Mo) can be used, for example. As a gate insulating layer, a known organic material or inorganic material can be used, as long as it is an electrically insulating layer such as silicon oxide (SiO2), silicon nitride (SiNx), or the like. As a channel layer, an oxide semiconductor including at least one selected from the group consisting of indium (In), gallium (Ga), and zinc (Zn) can be used. As a channel protection layer, silicon oxynitride (SiON), silicon nitride (SiNx), or aluminum oxide (AlOx) can be used, for example. As a source electrode or drain electrode, a laminate of copper manganese (CuMn), copper (Cu), and molybdenum (Mo) can be used, for example.

For the insulating layer of an upper portion of a TFT, silicon oxide (SiO2), silicon nitride (SiN) and silicon oxynitride (SiON), or silicon oxide (SiO) and silicon oxynitride (SiON) can be used, for example. As a connecting electrode layer of a TFT, a laminate of molybdenum (Mo), copper (Cu), and copper manganese (CuMn) can be used, for example. Material used for a connecting electrode layer is not limited to the examples above, and may be appropriately selected from materials that are conductive.

As a material of the interlayer insulating layer 118 (lower layer 118A and upper layer 118B) disposed on the top surface of the substrate 100x, an organic compound such as polyimide resin, acrylic resin, siloxane resin, novolac phenolic resin, or the like can be used.

(2) Pixel Electrodes 119, Auxiliary Electrode Layers 200, and Dummy Pixel Electrodes 102

The pixel electrodes 119 and the dummy pixel electrodes 102 (electrodes 102a and electrodes 102b) include metal material. According to at least one embodiment, the organic EL display panel 10 is a top-emission display panel, chromaticity of emitted light is adjusted by setting thickness appropriately for an optical resonator structure, and a surface of the pixel electrodes 119 has high reflectivity in order to increase luminance. In the organic EL display panel 10 pertaining to at least one embodiment, the pixel electrodes 119 have a structure in which a plurality of thin films selected from a metal layer, an alloy layer, and a light-transmissive electrically-conductive thin film are laminated. The metal layer can include a metal material including silver (Ag) or aluminum (Al), for example. The alloy layer can include an alloy of silver, palladium, and copper (APC), an alloy of silver, rubidium, and gold (ARA), an alloy of molybdenum and chromium (MoCr), an alloy of nickel and chromium (NiCr), or the like. The light-transmissive electrically-conductive thin film can include indium tin oxide (ITO), indium zinc oxide (IZO), or the like.

The auxiliary electrode layers 200 and the pixel electrodes 119 are made from the same materials.

(3) Hole Injection Layers 120

The lower layers 120A of the hole injection layers 120 are each a layer including an oxide of, for example, silver (Ag), molybdenum (Mo), chromium (Cr), vanadium (V), tungsten (W), nickel (Ni), iridium (Ir), or the like. According to at least one embodiment, the lower layers 120A are made of an oxide of a transition metal, a plurality of valences can be taken, and therefore a plurality of levels can be taken, and as a result, holes can be easily injected and driving voltage can be reduced. According to at least one embodiment, the lower layers 120A include an oxide of tungsten (W). As the ratio of pentavalent tungsten atoms to hexavalent tungsten atoms (W5+/W6+) increases, driving voltage of organic EL elements decreases, and therefore the oxide of tungsten (W) includes at least a defined value of pentavalent tungsten atoms.

According to at least one embodiment, the upper layers 120B of the hole injection layers 120 are each an applied film including an organic polymer solution of an electrically conductive polymer material such as poly(3,4-ethylenedioxythiophene) polystyrene sulfonate (PEDOT:PSS).

(4) Banks 122

The banks 122 include an organic material such as resin and have an insulating property. Examples of organic material that may be used in forming the banks 122 include acrylic resin, polyimide resin, novolac phenolic resin, or the like. According to at least one embodiment, the banks 122 have organic solvent resistance. According to at least one embodiment, the banks 122 include acrylic resin. Acrylic resin has a low refractive index and is suitable as a reflector.

According to at least one embodiment, the banks 122 include inorganic material, and silicon oxide (SiO) is used for its refractive index, for example. According to at least one embodiment, an inorganic material such as silicon nitride (SiN), silicon oxynitride (SiON), or the like is used.

The banks 122 are subjected to etching processing, baking processing, or the like during manufacture, and therefore according to at least one embodiment the banks 122 include a highly resistant material that does not excessively deform or change during such processing.

In order to make surfaces of the banks 122 liquid repellant, the surfaces can be treated with fluorine. According to at least one embodiment, material including fluorine is used in forming the banks 122. In order to decrease liquid repellency of surfaces of the banks 122, the banks 122 can be irradiated with ultraviolet light and baking can be performed at low temperature.

(5) Hole Transport Layers 121

According to at least one embodiment, the hole transport layers 121 include a polymer compound such as polyfluorene, a derivative thereof, polyarylamine (an amine organic polymer), a derivative thereof, poly(9,9-di-n-octylfluorene-alt-(1-4-phenylene-((4-sec-butylphenyl)imino)1,4-phenylene)) (TFB), or the like.

(6) Light Emitting Layers 123

The light emitting layers 123 have a function of generating an excited state via recombination of injected holes and electrons. Material used in forming the light emitting layers 123 includes a light emitting organic material that can be formed by a wet printing method.

More specifically, according to at least one embodiment, the light emitting layers include a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal compound of a 2-bipyridine compound, complex of a Schiff base and a group III metal, metal complex of oxine, rare earth metal complex, or the like.

(7) Electron Transport Layer 124

The electron transport layer 124 uses an organic material that has a high electron transport property. According to at least one embodiment, the organic material used in the electron transport layer 124 is a π electron low molecular weight organic material such as an oxadiazole derivative (OXD), a triazole derivative (TAZ), a phenanthroline derivative (BCP, Bphen), or the like. Further, according to at least one embodiment, the electron transport layer 124 includes a layer formed by doping an organic material having a high electron transport property with a doping material selected from alkali metals or alkaline earth metals. According to at least one embodiment, the electron transport layer 124 includes a layer formed of sodium fluoride. The alkali metals are lithium (Li), sodium (Na), potassium (K), rubidium (Rb), cesium (Cs), and francium (Fr). Alkaline earth metals include calcium (Ca), strontium (Sr), barium (Ba), and radium (Ra).

(8) Common Electrode Layer 125

The common electrode layer 125 includes a light-transmissive electrically-conductive material. According to at least one embodiment, indium tin oxide (ITO) or indium zinc oxide (IZO) is used. According to at least one embodiment, a thin film of silver (Ag) or aluminum (Al) is used.

(9) Sealing Layer 126

The sealing layer 126 has a function of suppressing exposure of organic layers such as the light emitting layers 123 to moisture and air, and includes a light transmissive material such as silicon nitride (SiN), silicon oxynitride (SiON), or the like. According to at least one embodiment, a sealing resin layer including a resin material such as acrylic resin, silicon resin, or the like is disposed on a layer including a material such as silicon nitride (SiN), silicon oxynitride (SiON), or the like.

According to at least one embodiment, the organic EL display panel 10 is a top-emission display panel and the sealing layer 126 includes a light-transmissive material.

(10) Joining Layer 127

Material of the joining layer 127 is a resin adhesive, or the like. According to at least one embodiment, the joining layer 127 includes a light-transmissive resin material such as acrylic resin, silicon resin, epoxy resin, or the like.

(11) Upper Substrate 130

As the upper substrate 130, a light-transmissive material such as a glass substrate, a quartz substrate, a plastic substrate, or the like can be used.

(12) Color Filter Layer 128

As the color filter layer 128, a known resin material (for example, as a commercially available product, a color resist manufactured by JSR Corporation) or the like can be used.

(13) Light Shielding Layer 129

As the light shielding layer 129, a resin material is used that includes an ultraviolet light curable resin (for example, ultraviolet curable acrylic resin) as a main component with a black pigment added thereto. As the black pigment, a light-shielding material can be used such as a carbon black pigment, a titanium black pigment, a metal oxidized pigment, an organic pigment, or the like.

2.5. Method of Manufacturing Organic EL Display Panel 10

A method manufacturing the organic EL display panel 10 is described with reference to FIG. 8A to FIG. 15.

(1) Prepare Substrate 100*x*

Figure 8A:
FIG. 8A to FIG. 8D are cross-section diagrams illustrating states in processes of manufacture of the organic EL display panel 10 according to at least one embodiment, and are cross-sections at the same position as a cross-section taken along A1-A1.

The substrate 100*x* is prepared, including wiring and TFTs including the wiring 110. The substrate 100*x* can be manufactured by a known TFT manufacturing method (FIG. 8A).

(2) Forming Interlayer Insulating Layer 118

Figure 8B:

Material (photosensitive resin material) of the lower layer 118A of the interlayer insulating layer 118 is applied as a photoresist so as to cover the substrate 100*x*, and the surface thereof is planarized to form the lower layer 118A of the interlayer insulating layer 118 (FIG. 8B).

Figure 8C:
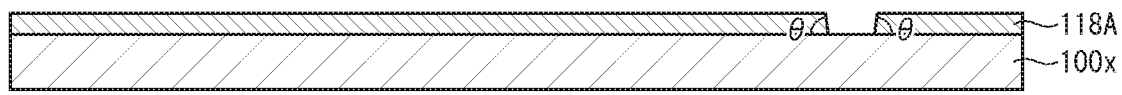

After forming the lower layer 118A of the interlayer insulating layer 118, a photomask including defined openings is overlaid, and ultraviolet light irradiation of the lower layer 118A of the interlayer insulating layer 118 is performed to transfer a pattern of the photomask (FIG. 8C).

Figure 8D:
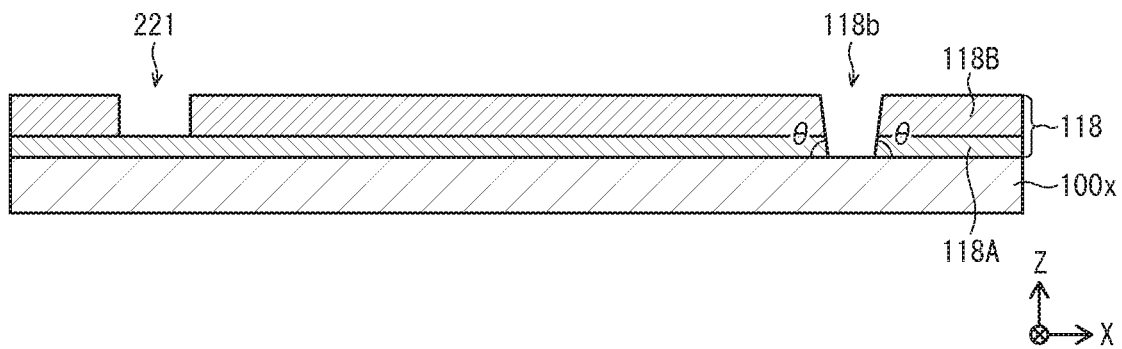

Subsequently, through developing, the upper layer 118B of the interlayer insulating layer 118 is formed in which the dummy pixel holes 221, the contact holes 118*a* (not illustrated in FIG. 8D, see FIG. 7), and the contact holes 118*b* (see FIG. 6) are patterned (FIG. 8D). The lower layer 118A is exposed at bottoms of the dummy pixel holes 221. Further, the wiring 110 is exposed at bottoms of the contact holes 118*a* (not illustrated in FIG. 8D) and the substrate 100*x* is exposed at bottoms of the contact holes 118*b*.

According to at least one embodiment, the lower layer 118A and the upper layer 118B of the interlayer insulating layer 118 are formed using a positive photoresist, but the lower layer 118A and the upper layer 118B of the interlayer insulating layer 118 may be formed using a negative photoresist.

(3) Forming Pixel Electrodes 119 and Auxiliary Electrode Layers 200

Figure 9A:
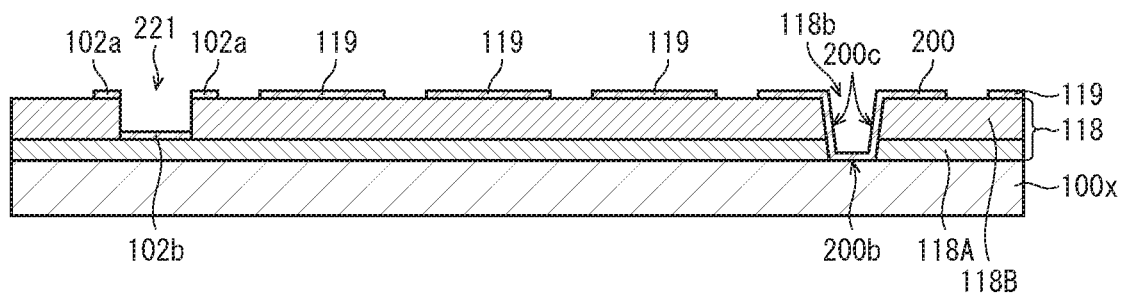
FIG. 9A to FIG. 9C are cross-section diagrams illustrating states in processes of manufacture of the organic EL display panel 10 according to at least one embodiment, and are cross-sections at the same position as a cross-section taken along A1-A1.

After forming the interlayer insulating layer 118 having the dummy pixel holes 221 and the contact holes 118*a*, 118*b*, the electrodes 102*a* and the electrodes 102*b* of the dummy pixel electrodes 102, the pixel electrodes 119, and the auxiliary electrode layers 200 are formed (FIG. 9A).

The electrodes 102*a*, the electrodes 102*b*, the pixel electrodes 119, and the auxiliary electrode layers 200 are formed by forming a metal film by sputtering or the like, and then patterning by using photolithography and etching. At this time, metal film formed along inner walls of the contact holes 118*a* forms the connecting cavities 119*c* of the pixel electrodes 119 (see FIG. 7). Further, metal film formed along inner walls of the contact holes 118*b* forms the connecting cavities 200*b* of the auxiliary electrode layers 200 that have the contact surfaces 200*c* along inner walls of the contact holes 118*b* (FIG. 9A).

The pixel electrodes 119 are in direct contact with the wiring 110 exposed at the bottoms of the contact holes 118*a* and are electrically connected to electrodes of TFTs (see FIG. 7).

(4) Forming Lower Layers 120A of Hole Injection Layers 120

Figure 9B:
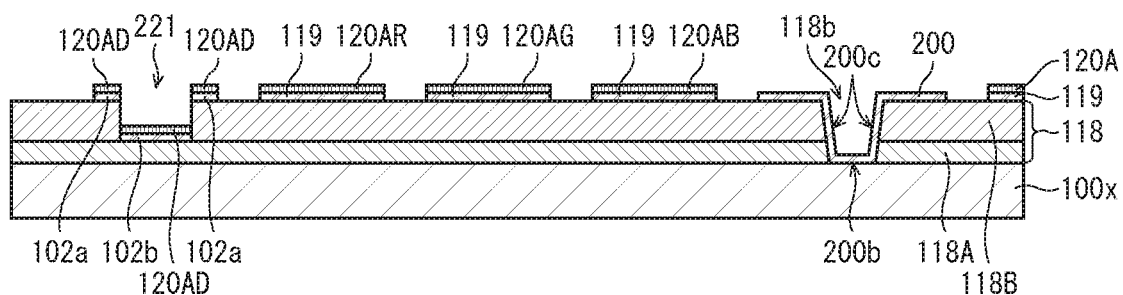

After forming the electrodes 102*a*, the electrodes 102*b*, the pixel electrodes 119, and the auxiliary electrode layers 200, the lower layers 120A of the hole injection layers 120 are formed on the electrodes 102*a*, the electrodes 102*b*, and the pixel electrodes 119. The lower layers 120AD of the hole injection layers 120 are formed on the electrodes 102*a* and the electrodes 102*b* (FIG. 9B).

The lower layers 120A and the lower layers 120AD are each formed by forming a metal film (for example, tungsten) by a vapor phase growth method such as sputtering or vacuum deposition, oxidizing the metal film by baking, and patterning pixel units via photolithography and etching.

(5) Forming Banks 122

After forming the lower layers 120A of the hole injection layers 120, the banks 122 are formed covering edges of the lower layers 120A and the auxiliary electrode layers 200.

Figure 9C:
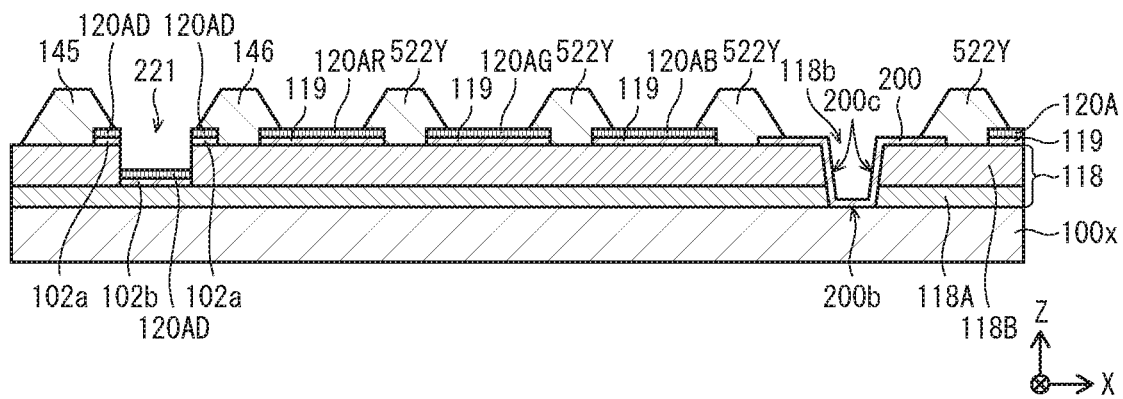

In formation of the banks 122, the row banks 122X, 141-144 are formed, and subsequently the column banks 522Y, 145-148 are formed (FIG. 9C).

The banks 122 are formed by first forming a layer from a material (for example, a photosensitive resin material) of the banks 122 on the lower layers 120A of the hole injection layers 120 by a spin coating method or the like. The resin layer is patterned to form the row banks 122X, 141-144 and the column banks 522Y, 145-148 in order. Patterning of the row banks 122X, 141-144 and the column banks 522Y, 145-148 is performed by exposing the resin layer to light from above with use of a photomask, developing, and baking (at approximately 230° C. for approximately 60 minutes).

More specifically, in forming the banks 122, first a photosensitive resin film including an organic photosensitive resin material such as acrylic resin, polyimide resin, novolac phenolic resin, or the like is formed, then dried, and after solvent is volatilized to a certain extent, a photomask having defined openings is overlaid on the photosensitive resin film, which is then irradiated by ultraviolet light from above, exposing the photoresist that is a photosensitive resin or the like and applying the pattern of the photomask to the photoresist. Subsequently, developing of the photosensitive resin forms the banks 122 as a patterned insulating layer. According to at least one embodiment, a positive photoresist is used. In a positive photoresist, portions exposed to light are removed by development. Portions of a mask pattern not exposed to light are not developed and remain.

(6) Forming Organic Functional Layer

Figure 12A:
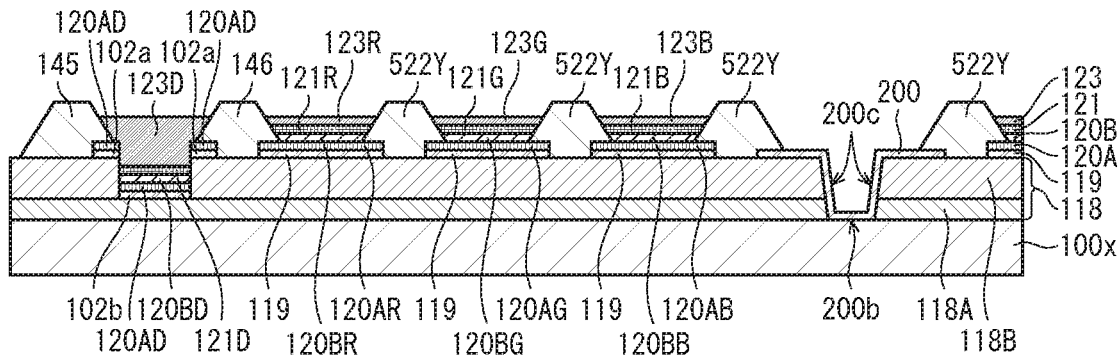
FIG. 12A to FIG. 12D are cross-section diagrams illustrating states in processes of manufacture of the organic EL display panel 10 according to at least one embodiment, and are cross-sections at the same position as a cross-section taken along A1-A1.

The upper layers 120B of the hole injection layers 120, the hole transport layers 121, and the light emitting layers 123 are formed in this order on the lower layers 120A of the hole injection layers 120 formed in the gaps 522z defined by the column banks 522Y, including on the row banks 122X, and defined by the row banks 141-144 and the column banks 145-148 (FIG. 12A).

The light emitting layers 123D have a greater film thickness than the light emitting layers 123R, the light emitting layers 123G, and the light emitting layers 123B (FIG. 12A).

For the upper layers 120B, ink containing an electrically conductive polymer material such as poly(3,4-ethylenedioxythiophene) polystyrene sulfonate (PEDOT:PSS) is applied in the gaps 522z via an inkjet method, and then solvent is volatilized and removed. Alternatively, baking is performed. Subsequently, patterning into pixel units may be performed by using photolithography and etching.

For the hole transport layers 121, after applying ink including constituent material to the gaps 522z by using a wet process such as inkjet or gravure printing, solvent is volatilized and removed. Alternatively, baking is performed. A method of applying ink of the hole transport layers 121 to the gaps 522z is the same as the method for the upper layers 120B. Alternatively, the hole transport layers 121 are formed by depositing a metal film (for example, tungsten) by sputtering and oxidizing it by baking. Subsequently, patterning into pixel units may be performed by using photolithography and etching.

The light emitting layers 123 are formed by applying ink including a constituent material of the light emitting layers 123 to the gaps 522zR, 522zG, 522zB, 522zD by an inkjet method, then baking.

More specifically, in this process, ink 123RI, 123GI, 123BI including R, G, B organic light emitting layer material fills the gaps 522zR, 522zG, 522zB, the ink is dried under low pressure and baked, thereby forming the light emitting layers 123R, 123G, 123B. Further, any one of the inks 123RI, 123GI, 123BI fills the gaps 522zD via an inkjet method, the ink is dried under low pressure and baked, thereby forming the light emitting layers 123D.

Application of a solution for forming the light emitting layers 123 is described below.

In application of liquid ink in the gaps 522zR, 522zG, 522zB, 522zD, a droplet discharge device (not illustrated) is used for applying a solution for forming the light emitting layers 123. Initially, the substrate 100x is mounted on a work table of the droplet discharge device such that the column direction of the substrate 100x is the Y direction and the row direction of the substrate 100x is the X direction.

Figure 10:
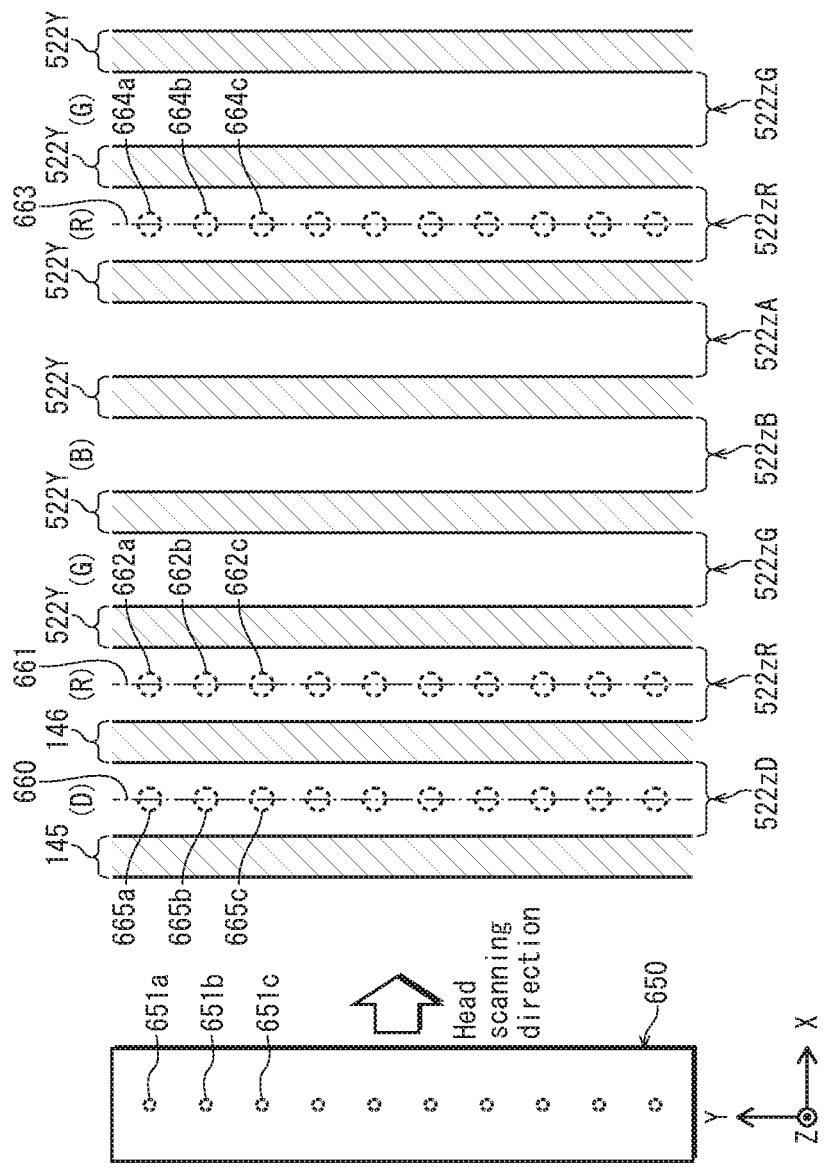
FIG. 10 is a schematic diagram illustrating liquid ink discharge according to inkjet head 650 of a droplet discharge device according to at least one embodiment.

In FIG. 10, discharge ports 651a, 651b, 651c . . . are arranged in an area elongated along the Y direction of an inkjet head 650 of the droplet discharge device.

Landing targets 665a, 665b, 665c . . . to which ink is to be applied are set on a center line 660 in the column direction of the dummy gap 522zD in the peripheral column region 15. Subsequently, the inkjet head 650 is moved in the X direction. When the discharge ports 651a, 651b, 651c . . . of the inkjet head 650 arrive above the landing targets 665a, 665b, 665c . . . , the inkjet head 650 discharges liquid ink.

Next, landing targets 662a, 662b, 662c . . . to which ink is to be applied are set on a center line 661 of the column direction of the red gaps 522zR. Subsequently, the inkjet head 650 is moved in the X direction. When the discharge ports 651a, 651b, 651c . . . of the inkjet head 650 arrive above the landing targets 662a, 662b, 662c . . . , the inkjet head 650 discharges liquid ink.

When discharge of liquid ink is complete, landing targets 664a, 664b, 664c . . . to which ink is to be applied are set on a center line 663 of the column direction of the next red gap 522zR, and the inkjet head 650 is moved in the X direction. When the discharge ports 651a, 651b, 651c . . . of the inkjet head 650 arrive above the landing targets 664a, 664b, 664c . . . , the inkjet head 650 discharges liquid ink. Thereafter, in the same way, the inkjet head 650 discharges liquid ink to subsequent red gaps 522zR.

When liquid ink discharge is complete for all the red gaps 522zR, liquid ink discharge is similarly performed with respect to all the green gaps 522zG. When liquid ink discharge is complete for all the green gaps 522zG, liquid ink discharge is similarly performed with respect to all the blue gaps 522zB. Finally, liquid ink discharge is performed with respect to the dummy gaps 522zD in the peripheral column region 16.

According to at least one embodiment, droplet volume of liquid ink to be discharged with respect to one dummy gap 522zD in the peripheral region 11 is set to be ten times droplet volume of liquid ink to be discharged with respect to one subpixel gap (any one of the gaps 522zR, 522zG, 522zB).

In this way, ink for forming red light emitting layers in the light emitting region 12 of the substrate 100x is applied, then ink for forming green light emitting layers is applied, then ink for forming the blue light emitting layers is applied. In FIG. 4, on the substrate 100x, the red light emitting layers, the green light emitting layers, and the blue light emitting layers are arranged alternating in the row direction. Further, ink is applied for forming the light emitting layer of dummy pixels in the peripheral region 11.

According to at least one embodiment, in order to form all of the light emitting layers 123D in the peripheral region 11, ink of any one color is used. According to at least one embodiment, in order to form each of the light emitting layers 123D in the peripheral row regions 13, 14, liquid ink of the same colors as the light emitting layers 123 present in the same column as the light emitting layer 123D is used. Further, according to at least one embodiment, blue liquid ink is used to form the light emitting layer 123D in the peripheral column region 15. Further, according to at least one embodiment, red liquid ink is used to form the light emitting layer 123D in the peripheral column region 16.

Details of methods of applying ink for the upper layers 120B and the hole transport layers 121 are the same as that for the light emitting layers 123.

Figure 11:
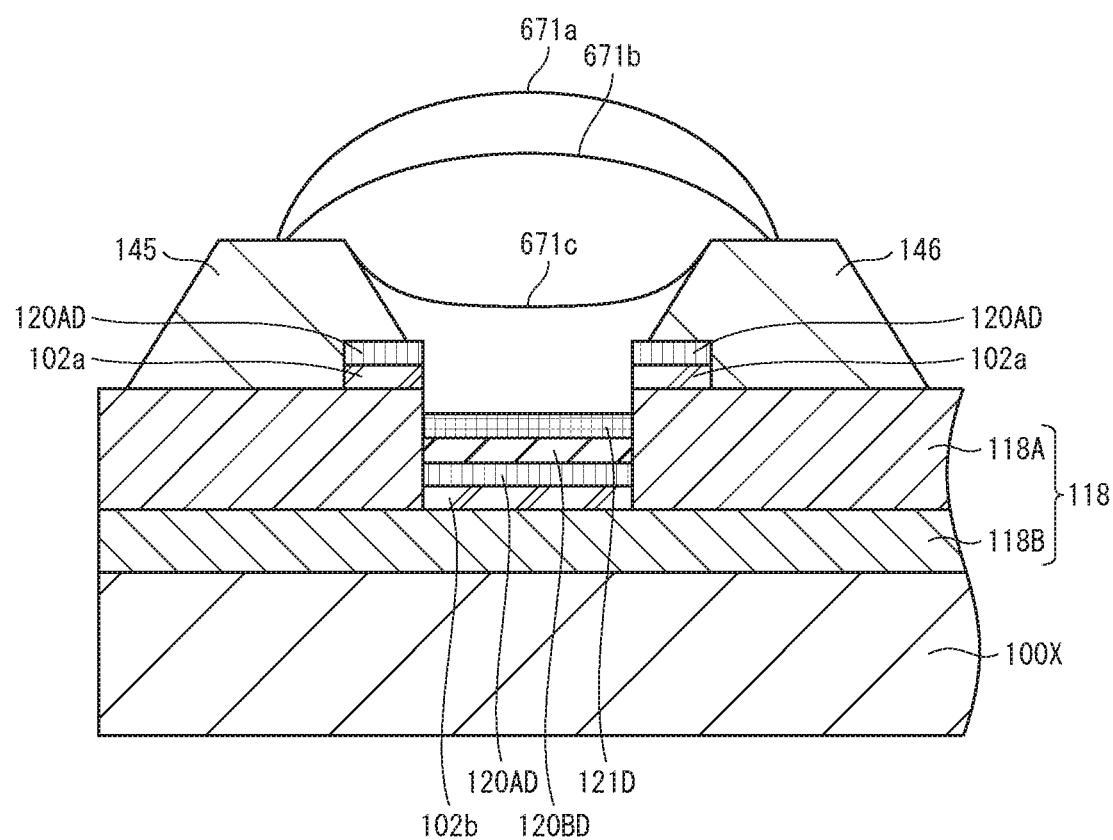
FIG. 11 is a schematic diagram illustrating changes of a liquid ink surface in a drying process of a light emitting layer 123D according to at least one embodiment.

FIG. 11 illustrates changes in liquid ink surfaces in the dummy gaps 522zD of dummy pixels.

Immediately after discharge of liquid ink, the liquid surface protrudes upward in a thickness direction of the substrate 100x, as illustrated by liquid surface 671a in FIG. 11. As drying proceeds, volume of each ink droplet decreases. In the dummy gaps 522zD, liquid surface changes in the order of the liquid surface 671a, liquid surface 671b, and liquid surface 671c, as illustrated in FIG. 11.

As described above, the dummy pixel holes 221 are formed in a portion of the interlayer insulating layer 118 below the dummy pixels in the peripheral region 11. Thus, when manufacturing the organic EL display panel 10, immediately after liquid ink is applied to the substrate 100x, liquid ink holding capacity of the dummy pixel holes 221 in the dummy gaps 522zD of dummy pixels in the peripheral region 11 is greater than liquid ink holding capacity of the red gaps 522zR, the green gaps 522zG, and the blue gaps 522zG (also referred to as color gaps) of subpixels in the light emitting region 12.

Thus, when liquid ink applied to the substrate 100x is dried, during drying, an amount of solvent evaporated from the dummy gaps 522zD of dummy pixels is greater than an amount of solvent evaporated from the color gaps in the peripheral portions of the light emitting region 12 (upper portion, lower portion, right portion, left portion). That is, partial pressure of solvent molecules evaporated from liquid ink applied to the dummy gaps 522zD of dummy pixels becomes greater than partial pressure of solvent molecules evaporated from liquid ink applied to the color gaps in the peripheral portions. As a result, solvent molecules evaporated from the dummy gaps 522zD inhibits drying of liquid ink applied to the color gaps in the peripheral portions of the light emitting regions 12. Thus, the difference between drying time of the color gaps in the central portion of the light emitting region 12 and drying time of the color gaps in the peripheral portions of the light emitting region 12 is decreased. Therefore, it is possible to suppress occurrence of film thickness unevenness between pixels in the central portion and the peripheral portions of the light emitting region 12.

Methods of forming the upper layers 120B of the hole injection layers 120, the hole transport layers 121, and the light emitting layers 123 are not limited to a method described above, and methods other than inkjet and gravure printing, for example known methods such as a dispenser method, nozzle coating method, spin coating method, intaglio printing, letterpress printing, or the like may be used for applying ink.

(7) Forming Electron Transport Layer 124

Figure 12B:
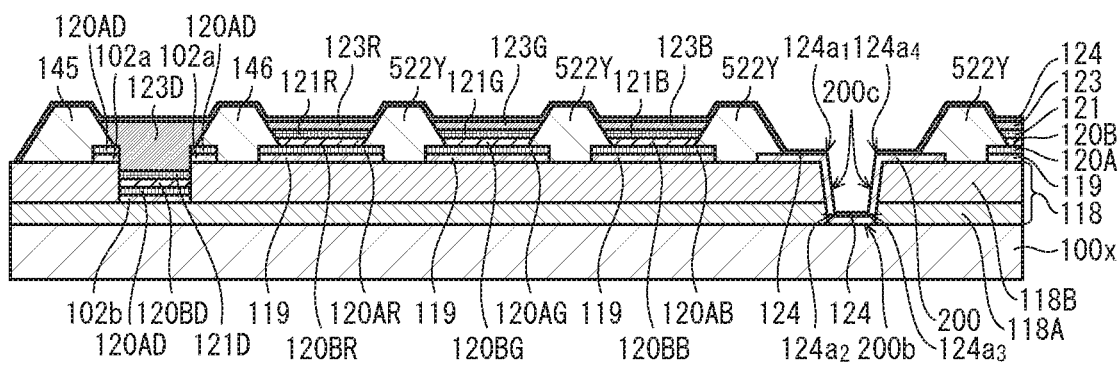

After forming the light emitting layers 123, the electron transport layer 124 is formed across the light emitting region 12 and the peripheral region 11 of the organic EL display panel 10 by a vacuum deposition method or the like (FIG. 12B). The electron transport layer 124 is also formed on the auxiliary electrode layer 200.

(8) Forming Common Electrode Layer 125

Figure 12C:
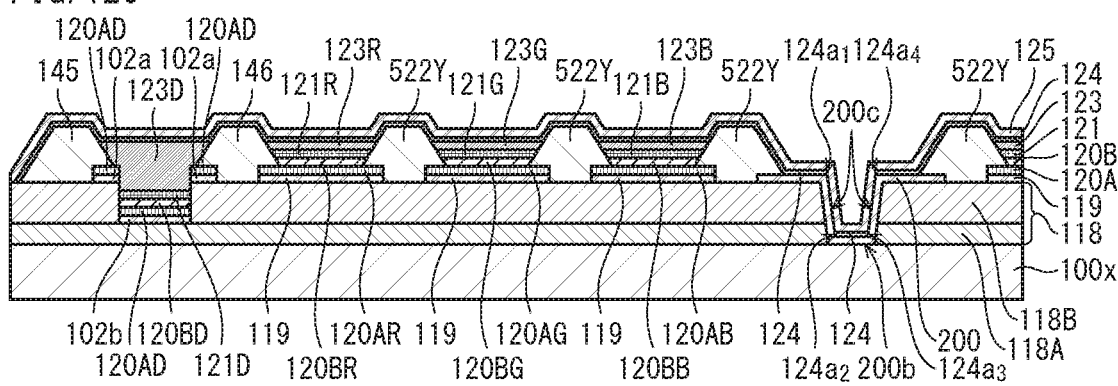

After forming the electron transport layer 124, the common electrode layer 125 is formed to cover the electrode transport layer 124 by sputtering or the like (FIG. 12C). The common electrode layer 125 is disposed on the electron transport layer 124 and in regions above the auxiliary electrode layers 200.

A method of forming the common electrode layer 125 is described here in more detail.

Figure 15:
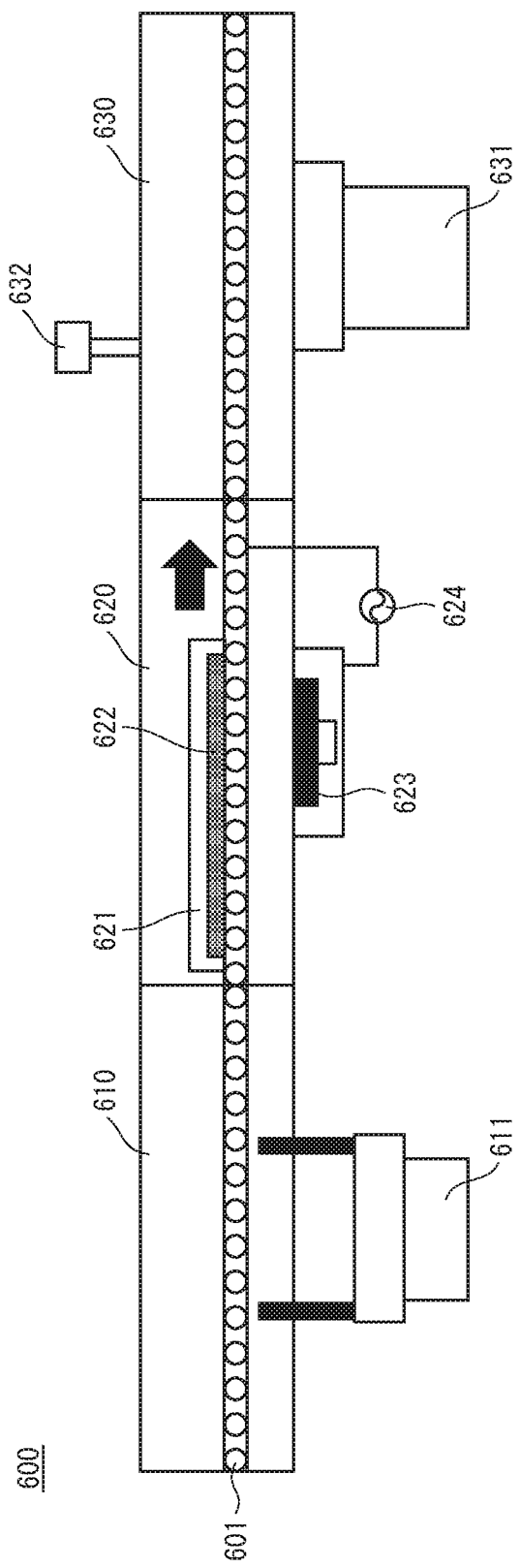
FIG. 15 is a schematic diagram illustrating structure of a sputter device 600 used in manufacture of a common electrode layer 125 according to at least one embodiment.

A schematic configuration of a sputter device 600 is described with reference to FIG. 15. The sputter device 600 includes a substrate delivery chamber 610, a film formation chamber 620, and a load lock chamber 630, and performs sputtering in the film formation chamber 620 by a magnetron sputtering method. A sputtering gas is introduced to the film formation chamber 620. An inert gas such as argon (Ar) or the like is used as the sputtering gas. According to at least one embodiment, Ar is used.

A substrate 622 that is a film-forming target is mounted on a carrier 621 in the sputter device 600. The substrate 622 is mounted on the carrier 621 by a substrate push up mechanism 611 in the substrate delivery chamber 610. The carrier 621 on which the substrate 622 is mounted moves linearly at a constant speed on a transport path 601 from the substrate delivery chamber 610 to the load lock chamber 630 via the film forming chamber 620. According to at least one embodiment, movement speed of the carrier 621 is 30 mm/s. The substrate 622 is not heated and sputtering is performed at a normal temperature.

A rod-shaped target 623 extending in a direction orthogonal to the transport path 601 is mounted in the film formation chamber 620. According to at least one embodiment, the target 623 is ITO. The target 623 is not necessarily rod-shaped, and may be in powder form, for example.

A power source 624 applies a voltage to the target 623. In FIG. 15, the power source 624 is an AC power source, but the power source 624 may be a DC power source or a hybrid AC/DC power source.

The inside of the sputter device 600 is exhausted by an exhaust system 631, and sputtering gas is introduced into the film forming chamber 620 by a gas supply system 632. When a voltage is applied to the target 623 by the power source 624, sputtering gas plasma is generated and a surface of the target 623 is sputtered. Atoms of the sputtered target 623 is deposited on the substrate 622 to form a film.

According to at least one embodiment, the sputtering gas is Ar, gas pressure is 0.6 Pa, and flow rate is 100 sccm.

(9) Forming Sealing Layer 126

Figure 12D:
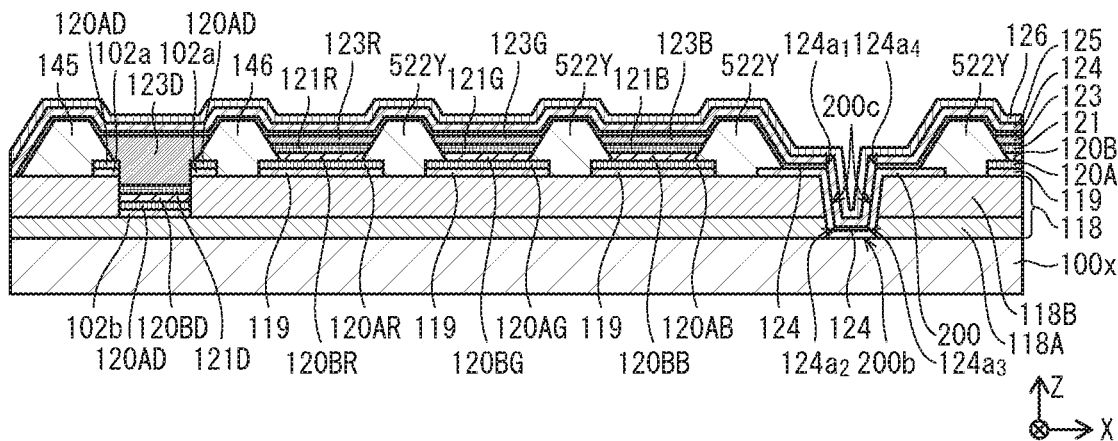

After forming the common electrode layer 125, the sealing layer 126 is formed so as to cover the common electrode layer 125 (FIG. 12D). The sealing layer 126 can be formed by using a chemical vapor deposition (CVD) method, sputtering, or the like.

(10) Forming Color Filter Substrate 131

The following describes an example of manufacture of the color filter substrate 131.

Figure 13A:
FIG. 13A to FIG. 13G are cross-section diagrams illustrating states in processes of manufacture of the organic EL display panel 10 according to at least one embodiment, and are cross-sections at the same position as a cross-section taken along A1-A1.

The upper substrate 130, which is light-transmissive, is prepared, and material of the light shielding layer 129, which is mainly composed of an ultraviolet light curable resin (for example, ultraviolet light curable acrylic resin) material to which black pigment is added, is applied to one surface of the upper substrate 130 (FIG. 13A).

Figure 13B:
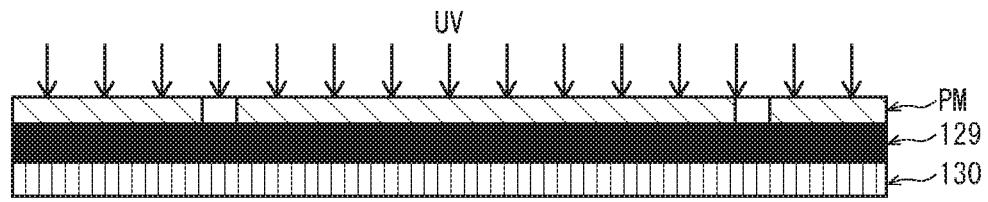

A pattern mask PM having defined openings is overlaid on a top surface of the applied shielding layer 129, and ultraviolet light irradiation is performed from above (FIG. 13B).

Figure 13C:
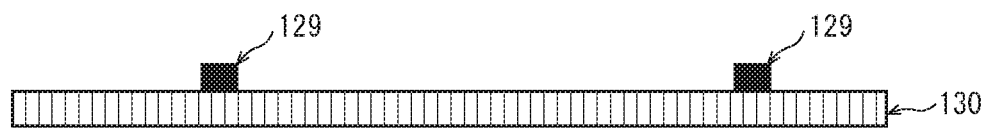

Subsequently, the pattern mask PM and uncured shielding layer 129 are removed by developing, and after curing the light shielding layer 129 that has a substantially rectangular cross-section shape is completed (FIG. 13C).

Figure 13D:
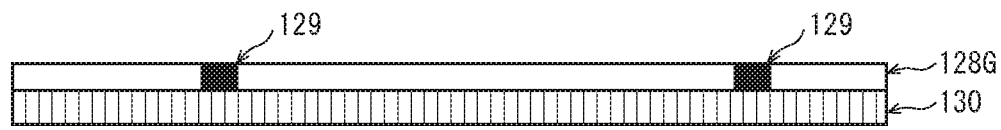
Figure 13E:
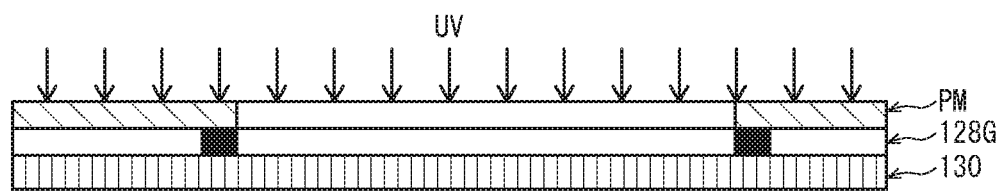

Next, for example, a material 128G of the color filter layer 128 mainly including an ultraviolet light curable resin component is applied to a surface of the upper substrate 130 on which the shielding layer 129 is formed (FIG. 13D), a defined pattern mask PM is overlaid, and ultraviolet light irradiation is performed (FIG. 13E).

Figure 13F:
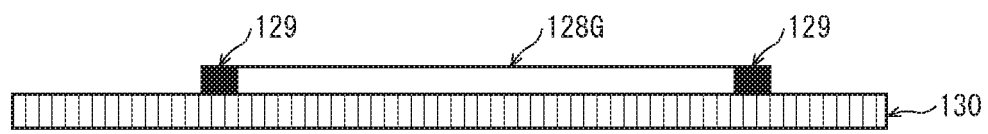

Subsequently curing is performed, the pattern mask PM and uncured material 128G are removed by developing, thereby forming a color filter layer 128G (FIG. 13F).

Figure 13G:
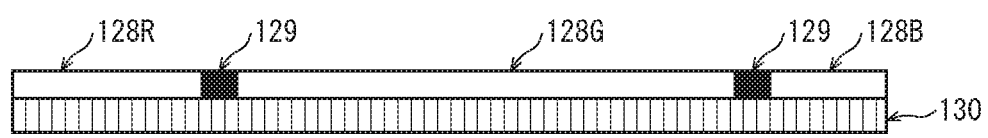

The processes illustrated in FIG. 13D, FIG. 13E, and FIG. 13F are similarly repeated for each color of color filter material to form color filter layers 128R, 128B (FIG. 13G). Instead of using a color filter material, a commercially available color filter product may be used.

Thus, the color filter substrate 131 is formed.

(11) Joining of Color Filter Substrate 131 and Back Panel

Figure 14A:
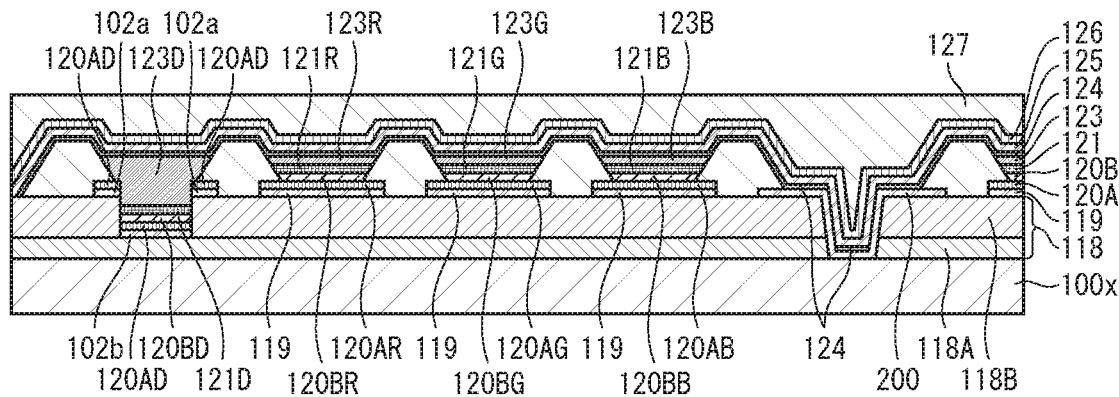
FIG. 14A and FIG. 14B are cross-section diagrams illustrating states in processes of manufacture of the organic EL display panel 10 according to at least one embodiment, and are cross-sections at the same position as a cross-section taken along A1-A1.

Next, material of the joining layer 127, which is mainly an ultraviolet light curable resin such as an acrylic resin, silicon resin, epoxy resin, or the like is applied to the back panel that includes all layers from the substrate 100x to the sealing layer 126 (FIG. 14A).

Figure 14B:
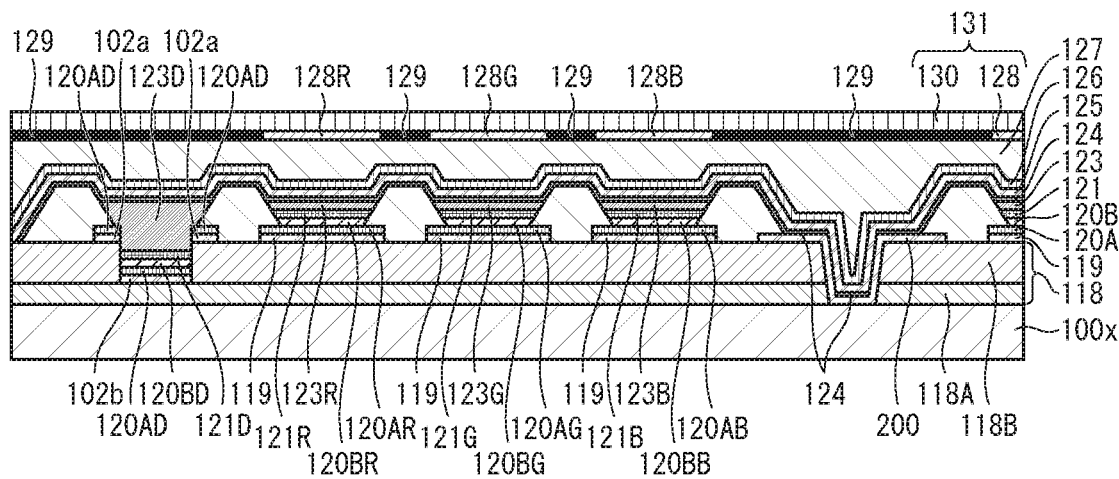

Subsequently, the applied material is irradiated with ultraviolet light, and the back panel and the color filter substrate 131 are joined such that positions of the back panel and the color filter substrate 131 relative to each other coincide. At this time, care is taken such that gas does not enter between the back panel and the color filter substrate 131. Subsequently, after baking and a sealing process are complete, the organic EL display panel 10 is complete (FIG. 14B).

2.6. Summary

As described above, the organic EL display panel 10 has an element array including, for example, a substantially rectangular light emitting region 12 and a frame-shaped peripheral region 11 above a substrate. In the light emitting region 12, subpixels are arranged in a matrix along the row and column directions. The peripheral region 11 surrounds the light emitting region 12 and does not contribute to light emission. The peripheral region 11 includes the peripheral row regions 13, 14 and the peripheral column regions 15, 16. In the peripheral row regions 13, 14, a plurality of dummy pixels 101 are arranged in lines in the row direction, and in the peripheral column regions 15, 16, a plurality of dummy pixels 101 are arranged in lines in the column direction.

The interlayer insulating layer 118 disposed on the top surface of the substrate 100x planarizes the top surface of the substrate 100x that is uneven due to the TFT layer. In the interlayer insulating layer 118, the dummy pixel holes 221 are provided corresponding to the dummy pixels 101. The dummy pixel holes 221 are provided in the interlayer insulating layer 118, and therefore liquid ink holding capacity of the dummy gaps 522zD including the dummy pixel holes 221 can be made greater than liquid ink holding capacity of the red gaps 522zR, the green gaps 522zG, and the blue gaps 522zB.

In the ink application process in manufacturing the organic EL display panel 10, liquid ink of each color is applied to pixel regions corresponding to subpixels and liquid ink is applied to the dummy pixel holes 221 corresponding to dummy pixels.

Immediately after liquid ink is applied to the substrate 100x, liquid ink volume per unit area of the dummy gaps 522zD of dummy pixels in the peripheral region 11 is greater than liquid ink volume per unit area of the red gaps 522zR, the green gaps 522zG, and the blue gaps 522 in the light emitting region 12.

Thus, when liquid ink applied to the substrate 100x is dried, during drying, an amount of solvent evaporated from the dummy gaps 522zD of dummy pixels is greater than an amount of solvent evaporated from the color gaps in the peripheral portions of the light emitting region 12 (upper portion, lower portion, right portion, left portion). That is, partial pressure of solvent molecules evaporated from liquid ink applied to the dummy gaps 522zD of dummy pixels becomes greater than partial pressure of solvent molecules evaporated from liquid ink applied to the color gaps in the peripheral portions. As a result, solvent molecules evaporated from the dummy gaps 522zD inhibit drying of liquid ink applied to the color gaps in the peripheral portions of the light emitting regions 12. Thus, the difference between drying time of the color gaps in the central portion of the light emitting region 12 and drying time of the color gaps in the peripheral portions of the light emitting region 12 is decreased. Therefore, it is possible to suppress occurrence of film thickness unevenness between pixels in the central portion and the peripheral portions of the light emitting region 12.

In this way, the dummy pixel holes 221 are provided in the interlayer insulating layer 118 corresponding to the dummy pixels 101, and liquid ink volume held per unit area by the dummy gaps 522zD is large. As a result, width of the peripheral region 11 can be narrowed. In this way, the significant effect is achieved of helping to prevent device enlargement.

3. Supplemental Explanation and Further Embodiments

At least one embodiment of the organic EL display panel 10 has been described, but the present disclosure is not limited to the embodiments described above, aside from essential characteristic constituent elements thereof. For example, embodiments obtained by applying various modifications arrived at by a person having ordinary skill in the art, and embodiments realized by combining any constituent elements and/or functions without departing from the gist of the present disclosure are included in the present disclosure. The following provides supplementary explanation of the organic EL display panel 10 and further embodiments thereof.

The following describes an organic EL display panel 10h according to at least one embodiment, in terms of differences from the organic EL display panel 10.

Figure 16:
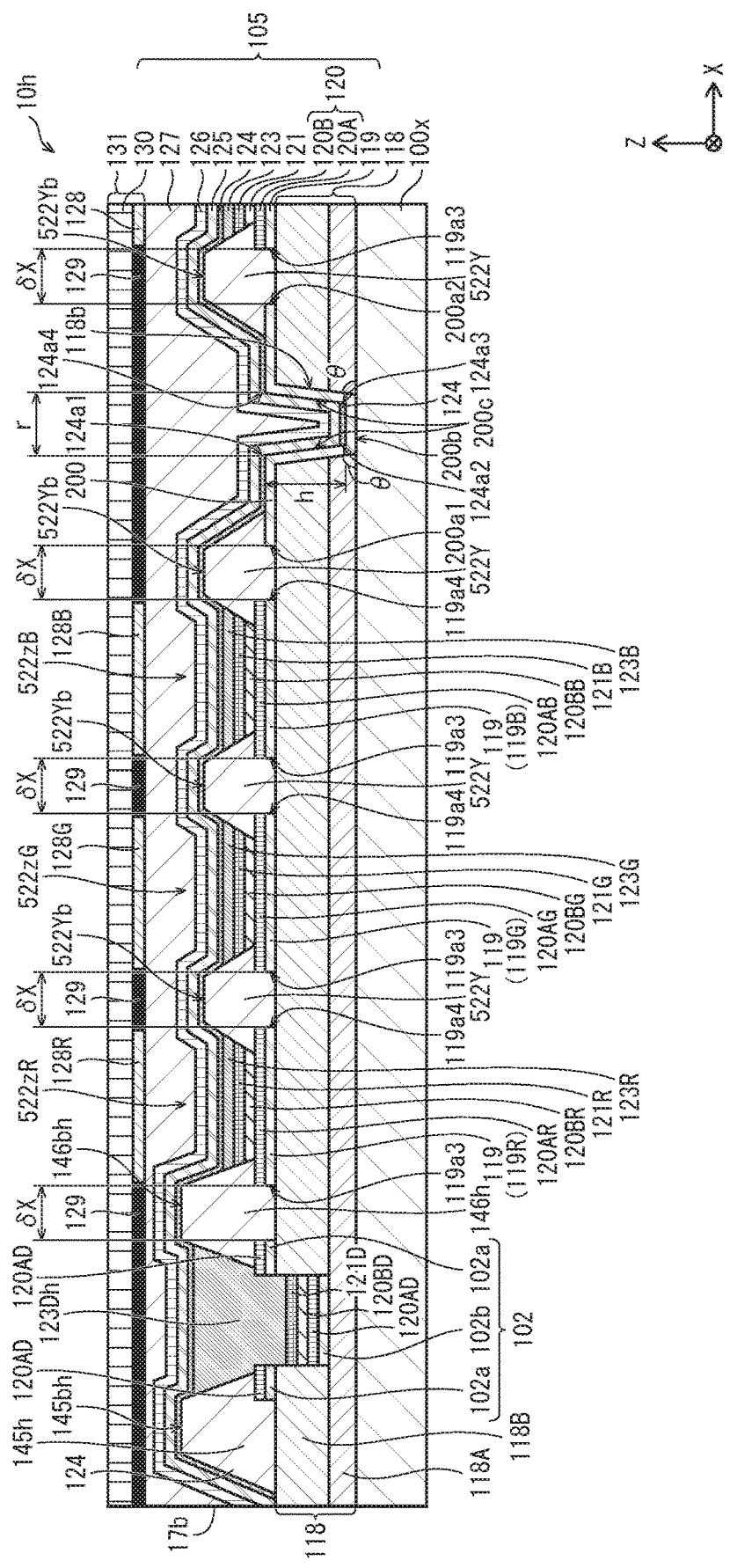
FIG. 16 is a cross-section diagram of a cross-section of an organic EL display panel 10h pertaining to at least one embodiment, corresponding to a cross-section taken along A1-A1.

FIG. 16 is a cross section diagram of the organic EL display panel 10h. The cross section illustrated in FIG. 16 corresponds to a cross section along A1-A1 in FIG. 4.

According to the organic EL display panel 10h, instead of the column banks 145, 146, 147, 148 of the organic EL display panel 10, column banks 145h, 146h, 147h (not illustrated), 148h (not illustrated) are arranged as illustrated in FIG. 16.

Further, according to the organic EL display panel 10h, instead of the row banks 141, 142, 143, 144 of the organic EL display panel 10, row banks 141h, 142h, 143h, 144h are arranged each extending in the row direction (not illustrated).

Here, height of the column banks 145h, 146h, 147h, 148h is greater than height of the column banks 145, 146, 147, 148.

Further, height of the row banks 141h, 142h, 143h, 144h is greater than height of the row banks 141, 142, 143, 144.

According to this configuration, in addition to the dummy pixel holes in the interlayer insulating layer 118, banks that partition the light emitting layers 123D of dummy pixels have a greater height than column banks and row banks partitioning the light emitting layers 123 of subpixels, and therefore liquid ink holding capacity of the dummy gaps 522zD is increased. As a result, solvent molecules evaporated from the dummy gaps 522zD inhibits drying of liquid ink applied to the color gaps in the peripheral portions of the light emitting regions 12. Thus, the difference between drying time of the color gaps in the central portion of the light emitting region 12 and drying time of the color gaps in the peripheral portions of the light emitting region 12 is decreased. Therefore, it is possible to suppress occurrence of film thickness unevenness between pixels in the central portion and the peripheral portions of the light emitting region 12.

In this way, a large volume of liquid ink per unit area is held by the dummy gaps 522zD, and therefore width of the peripheral regions 11 can be narrowed. In this way, the significant effect is achieved of helping to prevent device enlargement.

The following describes an organic EL display panel 10i according to at least one embodiment, in terms of differences from the organic EL display panel 10.

Figure 17:
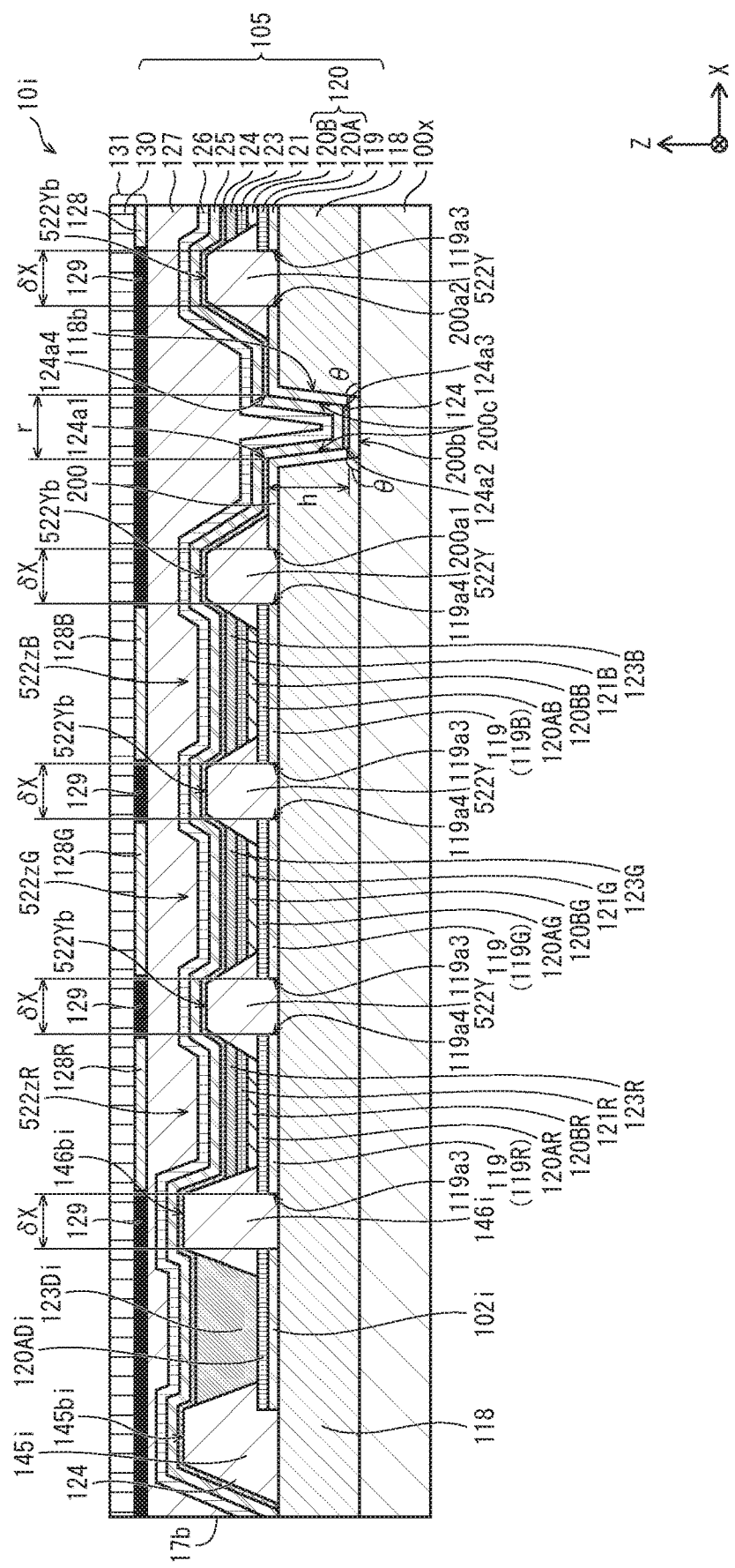
FIG. 17 is a cross-section diagram of a cross-section of an organic EL display panel 10i pertaining to at least one embodiment, corresponding to a cross-section taken along A1-A1.

FIG. 17 is a cross section diagram of the organic EL display panel 10i. The cross section illustrated in FIG. 17 corresponds to a cross section along A1-A1 in FIG. 4.

According to the organic EL display panel 10i, in FIG. 17, dummy pixel electrodes 102i and lower layers 120ADi of the hole injection layers 120 are disposed on the interlayer insulating layer 118.

According to the organic EL display panel 10i, instead of the column banks 145, 147, 147, 148 of the organic EL display panel 10, column banks 145i, 146i, 147i (not illustrated), 148i (not illustrated) are arranged as illustrated in FIG. 17.

Further, according to the organic EL display panel 10i, instead of the row banks 141, 142, 143, 144 of the organic EL display panel 10, row banks 141i, 142i, 143i, 144i are arranged each extending in the row direction (not illustrated).

The column banks 145i, 146i, 147i, 148i and the row banks 141i, 142i, 143i, 144i are formed above the interlayer insulating layer 118, on outer edges of the dummy pixel electrodes 102i, and on outer edges of the lower layer 120ADi of the hole injection layers 120.

Here, height of the column banks 145i, 146i, 147i, 148i is greater than height of the column banks 145, 146, 147, 148.

Further, height of the row banks 141i, 142i, 143i, 144i is greater than height of the row banks 141, 142, 143, 144.

In summary, the organic EL display panel 10i includes first banks partitioning light emitting layers and second banks partitioning dummy light emitting layers, and height of the second banks from the substrate is greater than height of the first banks from the substrate.

According to this configuration, banks partitioning dummy pixel holes have a greater height than other column and row banks, and this increases volume of liquid ink held by the dummy gaps 522zD. As a result, solvent molecules evaporated from the dummy gaps 522zD inhibits drying of liquid ink applied to the color gaps in the peripheral portions of the light emitting regions 12. Thus, the difference between drying time of the color gaps in the central portion of the light emitting region 12 and drying time of the color gaps in the peripheral portions of the light emitting region 12 is decreased. Therefore, it is possible to suppress occurrence of film thickness unevenness between pixels in the central portion and the peripheral portions of the light emitting region 12.

In this way, a large volume of liquid ink per unit area is held by the dummy gaps 522zD, and therefore width of the peripheral regions 11 can be narrowed. In this way, the significant effect is achieved of helping to prevent device enlargement.

The following describes an organic EL display panel 10j according to at least one embodiment, in terms of differences from the organic EL display panel 10. According to at least one embodiment, size of a dummy pixel region in which a dummy pixel is disposed is larger than a pixel region in which a subpixel is disposed. However, the present disclosure is not limited to this example. As described below, size of a dummy pixel region in which a dummy pixel is disposed may be equal in size to a region including a pixel region in which a set of a defined number of subpixels are disposed. Further, a dummy pixel hole where a dummy pixel is formed may correspond to a defined number of pixels.

Figure 18:
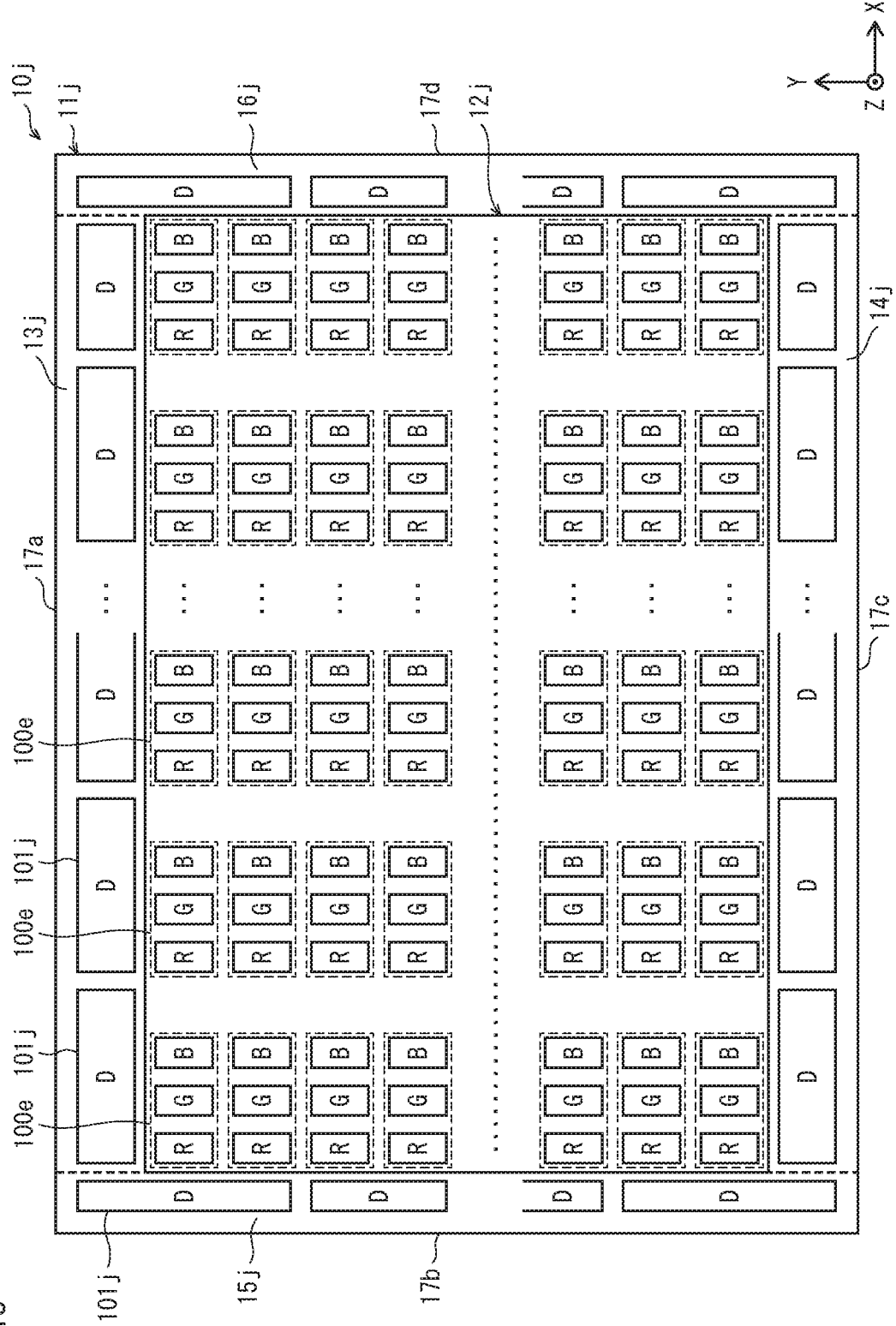
FIG. 18 is a plan view schematic diagram illustrating arrangement of a light emitting region 12j and a peripheral region 11j in an organic EL display panel 10j pertaining to at least one embodiment.

The organic EL display panel 10j in FIG. 18, similarly to the organic EL display panel 10, includes a substantially rectangular light-emitting region 12j and a frame-shaped peripheral region 11j, for example.

Unit pixels 100e are arranged in a matrix along the row and column directions in the light emitting region 12j. The light emitting region 12j is the same the light emitting region 12.

The peripheral region 11j includes peripheral row regions 13j, 14j and peripheral column regions 15j, 16j. The peripheral region 11j has a frame shape such that the peripheral row regions 13j, 14j and the peripheral column regions 15j, 16j surround four sides of the light emitting region 12j. Each of the peripheral row regions 13j, 14j has a band shape extending in the row direction and is disposed so as to contact an outer edge in the column direction of the light emitting region 12j. Each of the peripheral column regions 15j, 16j has a band shape extending in the column direction and is disposed so as to contact an outer edge in the row direction of the light emitting region 12j.

A plurality of dummy pixels 101j are disposed in a line in the row direction in the peripheral row regions 13j, 14j. Specifically, in the peripheral row regions 13j, 14j, each dummy pixel 101j along the row direction is disposed corresponding to a set of a red subpixel 100seR, a green subpixel 100seG, and a blue subpixel 100seB.

A plurality of dummy pixels 101j are disposed in a line in the column direction in the peripheral row regions 15j, 16j. More specifically, in the peripheral column regions 15j, 16j, the dummy pixels 101j are disposed in the column direction corresponding to two sets of subpixels that are adjacent in the column direction.

That is, the dummy pixels 101j are arranged so as to surround outer edges on four sides of the light emitting region 12. A region in which dummy pixels are arranged is called a dummy pixel region.

In FIG. 18, size of a dummy pixel region in which a dummy pixel 101*j* is disposed is equal in size to a region including a pixel region in which a defined number of sets of subpixels are disposed.

The dummy pixels 101*j* are used for reducing unevenness in thickness of light emitting films between subpixels 100*se*, by reducing a difference in drying time of ink applied to light emitting layers of the subpixels 100*se* between subpixels 100*se* disposed in a central portion of the light emitting region 12*j* and subpixels 100*se* disposed in peripheral portions of the light emitting region 12*j*. The dummy pixels 101*j* do not emit light.

As illustrated in FIG. 18, according to at least one embodiment, a number of gaps between the dummy pixels 101*j* is less than a number of gaps between the dummy pixels 101. Thus, a total sum of surface area of dummy pixel regions in which the dummy pixels 101*j* are disposed is greater than a total sum of surface area of dummy pixel regions in which the dummy pixels 101 are disposed, and volume of liquid ink that can be held in the dummy gaps 522*n*D that include dummy pixel holes is increased.

The following describes an organic EL display panel 10*k* according to at least one embodiment, in terms of differences from the organic EL display panel 10. According to at least one embodiment, size of a dummy pixel region in which a dummy pixel is disposed is larger than a pixel region in which a subpixel is disposed. However, the present disclosure is not limited to this example. As described below, the peripheral region may be configured such that only one dummy pixel is formed in the peripheral region, and the dummy pixel hole in which the dummy pixel is formed is a loop-shaped groove surrounding the light emitting region.

Figure 19:
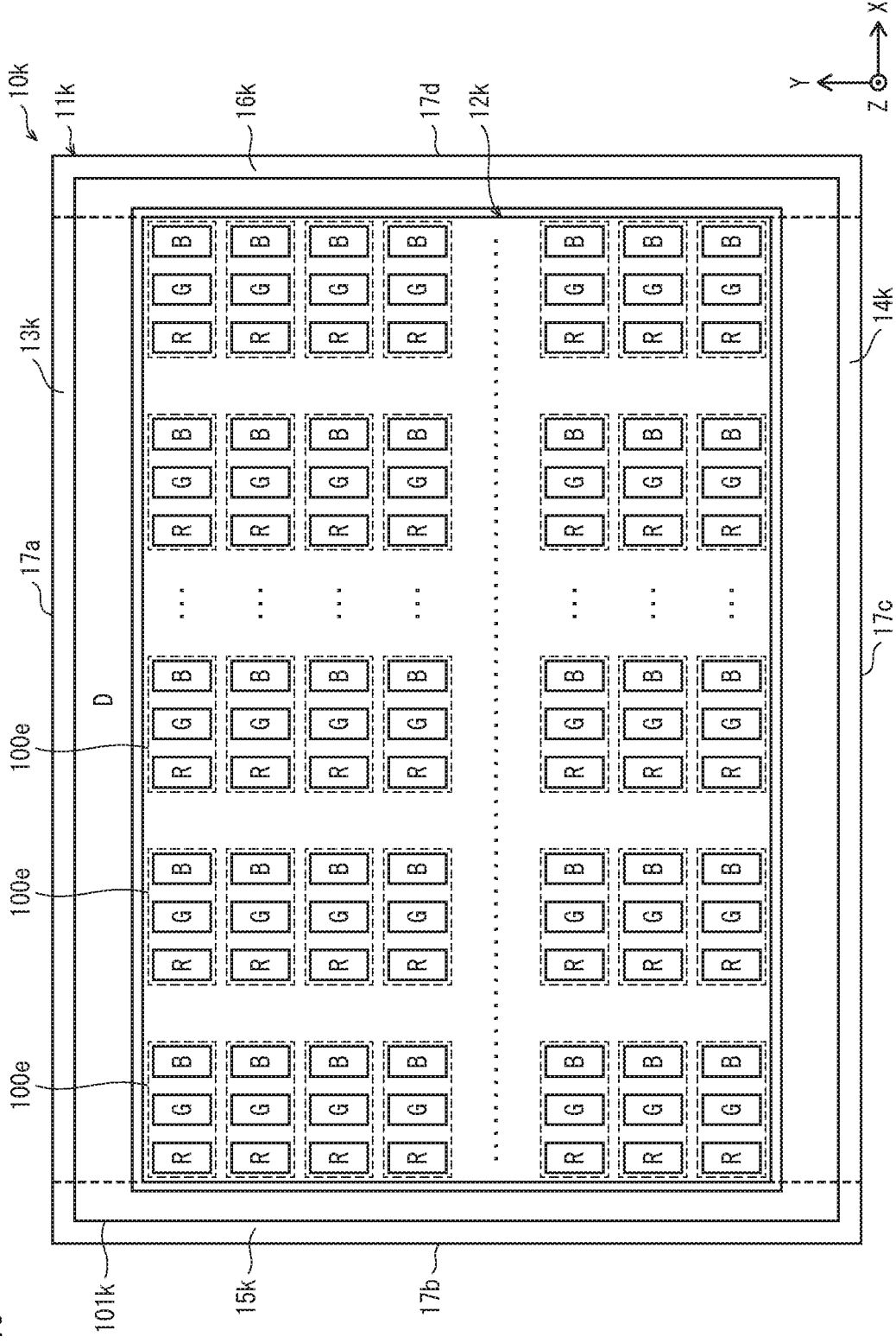
FIG. 19 is a plan view schematic diagram illustrating arrangement of a light emitting region 12k and a peripheral region 11k in an organic EL display panel 10k pertaining to at least one embodiment.

The organic EL display panel 10*k* in FIG. 19, similarly to the organic EL display panel 10, includes a substantially rectangular light-emitting region 12*k* and a frame-shaped peripheral region 11*k*, for example.

Unit pixels 100*e* are arranged in a matrix along the row and column directions in the light emitting region 12*k*. The light emitting region 12*k* is the same the light emitting region 12.

The peripheral region 11*k* includes peripheral row regions 13*k*, 14*k* and peripheral column regions 15*k*, 16*k*. The peripheral region 11*k* has a frame shape such that the peripheral row regions 13*k*, 14*k* and the peripheral column regions 15*k*, 16*k* surround four sides of the light emitting region 12*k*. Each of the peripheral row regions 13*k*, 14*k* has a band shape extending in the row direction and is disposed so as to contact an outer edge in the column direction of the light emitting region 12*k*. Each of the peripheral column regions 15*k*, 16*k* have a band shape extending in the column direction and is disposed so as to contact an outer edge in the row direction of the light emitting region 12*k*.

A single dummy pixel 101*k* is formed in the peripheral region 11*k* that includes the peripheral row regions 13*k*, 14*k* and the peripheral column regions 15*k*, 16*k*, so as to surround four sides of the light emitting region 12*k*. The dummy pixel hole in which the dummy pixel 101*k* is formed is in a loop-shaped groove surrounding the light emitting region 12*k*. Here, a region in which the dummy pixel 101*k* is disposed is called a dummy pixel region.

The dummy pixel 101*k* is used for reducing unevenness in thickness of light emitting films between subpixels 100*se*, by reducing a difference in drying time of ink applied to light emitting layers of the subpixels 100*se* between subpixels 100*se* disposed in a central portion of the light emitting region 12*k* and subpixels 100*se* disposed in peripheral portions of the light emitting region 12*k*. The dummy pixel 101*k* does not emit light.

In FIG. 19, the dummy pixel hole in which the dummy pixel 101*k* is formed is a loop-like groove surrounding the light emitting region 12*k* and there is no gap between adjacent dummy pixels. Thus, a total sum of surface area of the dummy pixel region in which the dummy pixels 101*k* is disposed is greater than a total sum of surface area of dummy pixel regions in which the dummy pixels 101 are disposed, and volume of liquid ink that can be held in the dummy gaps 522*n*D that include dummy pixel holes is increased.

(5) According to at least one embodiment, height of the row bank 142 from the substrate is equal to height of the column banks 522Y from the substrate, and height of the row bank 143 from the substrate is equal to height of the column banks 522Y from the substrate. Thus, flow of liquid ink between the light emitting region 12 and the peripheral row region 13 is restricted, and flow of liquid ink between the light emitting region 12 and the peripheral row region 14 is restricted. However, the present disclosure is not limited to this example.

For each light emitting layer of a dummy pixel disposed in the peripheral row region 13 and the peripheral row region 14, liquid ink the same color as liquid ink applied to the light emitting layer of a subpixel disposed in the same column may be used.

In such a case, height of the row bank 142 from the substrate may be equal to height of the row banks 122X from the substrate. Further, height of the row bank 143 from the substrate may be equal to height of the row banks 122X from the substrate. Thus, flow of liquid ink between the light emitting region 12 and the peripheral row region 13 is restricted, and flow of liquid ink between the light emitting region 12 and the peripheral row region 14 is restricted.

According to at least one embodiment, for each light emitting layer of a dummy pixel disposed in the peripheral row region 13 and the peripheral row region 14, liquid ink the same color as liquid ink applied to the light emitting layer of a subpixel disposed in the same column is used, and therefore no problem occurs even if liquid ink mixes between the light emitting layer of the dummy pixel and the light emitting layer of the subpixel disposed in the same column.

(6) According to at least one embodiment, the same color of liquid ink is used for light emitting layers of dummy pixels arranged in a line in the column direction in the peripheral column region 15 and the peripheral column region 16.

When the droplet discharge device in FIG. 10 is used, liquid ink application for light emitting layers of dummy pixels disposed in a line in the column direction of the peripheral column region 15 (or the peripheral column region 16) is possible through one discharge of ink droplets discharged from the discharge ports 651*a*, 651*b*, 651*c* . . . of the inkjet head 650.

(7) According to at least one embodiment of the organic EL display panel 10, the light emitting layers 123 extend continuously in the column direction over the row banks. However, the light emitting layers 123 may be configured to be discontinuous such that each pixel is separated by the row banks.

(8) According to at least one embodiment of the organic EL display panel 10, colors of light emitted from the light emitting layers 123 of subpixels 100*se* disposed in the gaps 522*z* between column banks 522Y that are adjacent in the row direction are different from each other, and the color of light emitted from the light emitting layers 123 of subpixels 100*se* disposed in gaps between the row banks 122X that are adjacent in the column direction is the same.

However, the organic EL display panel 10 may be configured such that the color of light emitted from the light emitting layers 123 of subpixels 100*se* adjacent in the row direction is the same, and colors of light emitted from the light emitting layers 123 of subpixels 100*se* adjacent in the column direction are different from each other. Further, colors of light emitted from the light emitting layers 123 of subpixels 100*se* adjacent in the row and column directions may be different from each other.

(9) According to at least one embodiment of the organic EL display panel 10, there are three types of the subpixels 100*se*—red pixels, green pixels, and blue pixels—but the present disclosure is not limited to this example. For example, there may be only one type of light emitting layer, and there may be four types of light emitting layer emitting red, green, blue, and yellow light.

(10) According to at least one embodiment, a plurality of unit pixels 100*e* are arrayed in rows and columns, but the present disclosure is not limited to this example. For example, when the intervals between pixel regions are one pitch, effects described in the present disclosure are also achieved for a configuration in which pixel regions that are adjacent are shifted by a half pitch in the column direction relative to each other. As increasingly high definitions are achieved for display panels, it becomes difficult to visually distinguish slight deviations in the column direction, and even if film thickness unevenness occurs along a straight line (or a staggered line) of a certain width, it is perceived as a band shape. Accordingly, it is possible to improve display quality of display panels by suppressing occurrence of uneven brightness arranged in a staggered line.

(11) According to at least one embodiment, the hole injection layers 120, the hole transport layers 121, the light emitting layers 123, and the electron transport layer 124 are disposed between the pixel electrodes 119 and the common electrode layer 125, but the present disclosure is not limited to this example. For example, according to at least one embodiment, only the light emitting layers 123 are present between the pixel electrodes 119 and the common electrode layer 125, without the hole injection layers 120, the hole transport layers 121, and the electron transport layer 124. Further, for example, hole injection layers, hole transport layers, an electron transport layer, an electron injection layer, or the like may be included, or a plurality or all of these layers may be included. Further, these layers need not necessarily be made of an organic compound, and may include an inorganic material or the like.

(12) According to at least one embodiment, a method of forming the light emitting layers 123 is described as using a wet film forming process such as a printing method, spin coating, inkjets, or the like, but the present disclosure is not limited to this example. For example, a dry film forming process may be used such as vacuum deposition, electron beam deposition, sputtering, reactive sputtering, ion plating, vapor phase growth, or the like. Further, known materials can be appropriately adopted as materials for each component element.

(13) According to at least one embodiment, the pixel electrodes 119, which are anodes in lower portions of organic EL elements, are connected to the wiring 110 that is connected to source electrodes of TFTs. However, according to at least one embodiment, a common electrode is disposed in lower portions of organic EL elements and anodes are disposed in upper portions of the organic EL elements. According to the latter case, a cathode disposed in the lower portions is connected to drains of TFTs.

(14) According to at least one embodiment, two transistors Tr1, Tr2 are provided for one subpixel 100*se*, but the present disclosure is not limited to this example. For example, one transistor may be provided for one subpixel, or three or more transistors may be provided for one subpixel.

(15) According to at least one embodiment, a top-emission EL display panel is described, but the present disclosure is not limited to this example. For example, a bottom emission display panel or the like may be used. In such a case, each component may be changed appropriately.

(16) Each embodiment described above represents a specific example of the present disclosure. Numerical values, shapes, materials, constituent elements, arrangement positions and connections of constituent elements, processes, order of processes, and the like indicated by embodiments are merely examples and are not intended to limit the present disclosure. Further, among the constituent elements, a process that is not described in an independent claim indicating a top level concept of the present disclosure is described as any constituent element of a more preferable form.

Further, the order in which processes are described as being executed is for illustrative purposes to explain the present disclosure in detail, but the order may be different from that described. Further, a portion of the processes may be executed simultaneously (in parallel) with other processes.

In addition, in order to facilitate understanding of the disclosure, scale of constituent elements in each drawing described with reference to at least one embodiment may be different from actual scale. Further, the present disclosure is not limited to the description of the embodiments, and can be appropriately changed without departing from the gist of the present disclosure.

Further, at least some of the functions of each embodiment and modifications thereof may be combined.

Further, various modifications that can be conceived of by a person having ordinary skill in the art are also included in the present disclosure.

The organic EL display panel and organic EL display device pertaining to the present disclosure can be widely used in devices such as television sets, personal computers, and mobile telephones, as well as various electronic devices that have a display panel.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:
1. An organic EL display panel comprising:
a substrate;
an element array above the substrate, the element array including a light emitting region and a peripheral region that does not emit light surrounding the light emitting region;
a planarizing layer disposed between the substrate and the element array so as to cover the substrate;
light emitting layers in the element array in the light emitting region, the light emitting layers including organic light emitting material; and a dummy light emitting layer in the element array in the peripheral region, the dummy light emitting layer including organic light emitting material, wherein a portion of the planarizing layer below the dummy light emitting layer is recessed, and a lower portion of the dummy light emitting layer extends inside the recessed portion.

2. The organic EL display panel of claim 1, further comprising:

first banks defining the light emitting layers; and second banks defining the dummy light emitting layer, wherein height of the second banks from the substrate is greater than height of the first banks from the substrate.

3. The organic EL display panel of claim 1, wherein the dummy light emitting layer is provided in plurality, and area occupied by each of the dummy light emitting layers on the substrate is greater than area occupied by each of the light emitting layers on the substrate.

4. The organic EL display panel of claim 1, wherein the dummy light emitting layer is provided in plurality, and each of the dummy light emitting layers corresponds to a defined number of light emitting layers.

5. The organic EL display panel of claim 1, wherein the recessed portion forms a loop-shaped groove surrounding the light emitting region.

6. The organic EL display panel of claim 1, further comprising pixel electrodes on the planarizing layer.

7. The organic EL display panel of claim 6, wherein the pixel electrodes are between the light emitting layers and the substrate.

8. The organic EL display panel of claim 6, wherein the portion of the planarizing layer below the dummy light emitting layer is recessed toward the substrate.

9. A method of manufacturing an organic EL display panel including an element array above a substrate, the element array including a light emitting region and a peripheral region that does not emit light surrounding the light emitting region, the method comprising:

preparing a substrate;

forming a planarizing layer so as to be disposed between the substrate and the element array and covering the substrate;

forming light emitting layers in the element array in the light emitting region, the light emitting layers including organic light emitting material; and recessing a portion of the planarizing layer corresponding to the peripheral region of the element array, and forming a dummy light emitting layer including organic light emitting material above the recessed portion so that the organic light emitting material of the dummy light emitting layer extends into the recessed portion.

10. The method of manufacturing of claim 9, further comprising forming pixel electrodes on the planarizing layer.

* * * * *